US011548101B2

(12) United States Patent
DeMuth et al.

(10) Patent No.: US 11,548,101 B2
(45) Date of Patent: Jan. 10, 2023

(54) LONG AND HIGH RESOLUTION STRUCTURES FORMED BY ADDITIVE MANUFACTURING TECHNIQUES

(71) Applicant: Seurat Technologies, Inc., Mountain View, CA (US)

(72) Inventors: James A DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 267 days.

(21) Appl. No.: 17/031,649

(22) Filed: Sep. 24, 2020

(65) Prior Publication Data

US 2021/0008623 A1    Jan. 14, 2021

Related U.S. Application Data

(63) Continuation of application No. 15/337,228, filed on Oct. 28, 2016, now Pat. No. 10,870,150.

(Continued)

(51) Int. Cl.
*B29C 64/386*    (2017.01)
*B23K 37/04*    (2006.01)
(Continued)

(52) U.S. Cl.
CPC ............ *B23K 37/0408* (2013.01); *B22F 3/24* (2013.01); *B22F 10/00* (2021.01); *B22F 12/00* (2021.01); *B22F 12/33* (2021.01); *B22F 12/38* (2021.01); *B22F 12/44* (2021.01); *B22F 12/70* (2021.01); *B23K 15/002* (2013.01); *B23K 15/0006* (2013.01); *B23K 15/0013* (2013.01);
(Continued)

(58) Field of Classification Search
CPC .......... B22F 12/44; B22F 12/33; B28B 1/001; B29C 64/153; B29C 64/386; B33Y 30/00; B23K 26/006; B23K 26/082; B23K 26/342; B23K 15/0086
See application file for complete search history.

(56) References Cited

U.S. PATENT DOCUMENTS 9,027,668 B2 *  5/2015  Zediker ................... E21B 44/00
                                                        175/16
2013/0108726 A1 *  5/2013  Uckelmann ............ A61C 13/20
                                                        425/375

* cited by examiner

*Primary Examiner* — Nahida Sultana
*Assistant Examiner* — Jamel M Nelson
(74) *Attorney, Agent, or Firm* — David R. Stevens; Stevens Law Group

(57) ABSTRACT

A method of additive manufacture suitable for large and high resolution structures is disclosed. The method may include sequentially advancing each portion of a continuous part in the longitudinal direction from a first zone to a second zone. In the first zone, selected granules of a granular material may be amalgamated. In the second zone, unamalgamated granules of the granular material may be removed. The method may further include advancing a first portion of the continuous part from the second zone to a third zone while (1) a last portion of the continuous part is formed within the first zone and (2) the first portion is maintained in the same position in the lateral and transverse directions that the first portion occupied within the first zone and the second zone.

13 Claims, 24 Drawing Sheets

Related U.S. Application Data

(60) Provisional application No. 62/248,966, filed on Oct. 30, 2015, provisional application No. 62/248,821, filed on Oct. 30, 2015, provisional application No. 62/248,765, filed on Oct. 30, 2015, provisional application No. 62/248,787, filed on Oct. 30, 2015, provisional application No. 62/248,780, filed on Oct. 30, 2015, provisional application No. 62/248,795, filed on Oct. 30, 2015, provisional application No. 62/248,758, filed on Oct. 30, 2015, provisional application No. 62/248,783, filed on Oct. 30, 2015, provisional application No. 62/248,980, filed on Oct. 30, 2015, provisional application No. 62/248,791, filed on Oct. 30, 2015, provisional application No. 62/248,833, filed on Oct. 30, 2015, provisional application No. 62/248,799, filed on Oct. 30, 2015, provisional application No. 62/248,835, filed on Oct. 30, 2015, provisional application No. 62/248,989, filed on Oct. 30, 2015, provisional application No. 62/248,848, filed on Oct. 30, 2015, provisional application No. 62/248,839, filed on Oct. 30, 2015, provisional application No. 62/248,829, filed on Oct. 30, 2015, provisional application No. 62/248,841, filed on Oct. 30, 2015, provisional application No. 62/248,968, filed on Oct. 30, 2015, provisional application No. 62/248,776, filed on Oct. 30, 2015, provisional application No. 62/248,969, filed on Oct. 30, 2015, provisional application No. 62/248,770, filed on Oct. 30, 2015, provisional application No. 62/248,847, filed on Oct. 30, 2015.

(51) Int. Cl.

| | | |
|---|---|---|
| *B29C 64/264* | (2017.01) | |
| *B29C 64/153* | (2017.01) | |
| *B33Y 10/00* | (2015.01) | |
| *B33Y 40/00* | (2020.01) | |
| *B33Y 50/02* | (2015.01) | |
| *B33Y 70/00* | (2020.01) | |
| *B33Y 80/00* | (2015.01) | |
| *B33Y 99/00* | (2015.01) | |
| *B23K 26/12* | (2014.01) | |
| *B23K 26/142* | (2014.01) | |
| *B23K 26/144* | (2014.01) | |
| *B23K 26/70* | (2014.01) | |
| *B29C 64/268* | (2017.01) | |
| *B22F 3/24* | (2006.01) | |
| *B23K 15/00* | (2006.01) | |
| *B23K 15/06* | (2006.01) | |
| *B23K 26/03* | (2006.01) | |
| *B23K 26/08* | (2014.01) | |
| *B23K 26/16* | (2006.01) | |
| *B23K 26/36* | (2014.01) | |
| *B25J 11/00* | (2006.01) | |
| *G02B 7/14* | (2021.01) | |
| *G02B 7/16* | (2021.01) | |
| *G02B 7/182* | (2021.01) | |
| *G02B 15/04* | (2006.01) | |
| *G02B 15/10* | (2006.01) | |
| *G02B 19/00* | (2006.01) | |
| *G02F 1/01* | (2006.01) | |
| *G02F 1/1333* | (2006.01) | |
| *G02F 1/135* | (2006.01) | |
| *G05B 17/02* | (2006.01) | |
| *H01S 5/40* | (2006.01) | |
| *B22F 12/00* | (2021.01) | |
| *B22F 10/00* | (2021.01) | |
| *H01S 5/00* | (2006.01) | |
| *B22F 12/33* | (2021.01) | |
| *B22F 12/44* | (2021.01) | |
| *B22F 12/70* | (2021.01) | |
| *G02B 27/10* | (2006.01) | |
| *B23K 26/00* | (2014.01) | |
| *B23K 26/082* | (2014.01) | |
| *B23K 101/00* | (2006.01) | |
| *B23K 101/24* | (2006.01) | |
| *B23K 103/00* | (2006.01) | |
| *B23K 101/02* | (2006.01) | |
| *B29K 105/00* | (2006.01) | |
| *G02B 27/28* | (2006.01) | |
| *G07C 3/14* | (2006.01) | |
| *B22F 10/10* | (2021.01) | |
| *B33Y 30/00* | (2015.01) | |
| *B23K 26/342* | (2014.01) | |
| *B28B 1/00* | (2006.01) | |
| *G02B 26/08* | (2006.01) | |
| *G02B 27/09* | (2006.01) | |
| *G02B 27/14* | (2006.01) | |
| *G02B 27/00* | (2006.01) | |

(52) U.S. Cl.
CPC ...... *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/264* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 19/0047* (2013.01); *G02B 27/108* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 10/10* (2021.01); *B22F 2003/247* (2013.01); *B22F 2003/248* (2013.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 26/0816* (2013.01); *G02B 27/0068* (2013.01); *G02B 27/0905* (2013.01); *G02B 27/141* (2013.01); *G02B 27/283* (2013.01); *G02B 27/286* (2013.01); *G05B 2219/49023*

(2013.01); *G07C 3/146* (2013.01); *Y02P 10/25* (2015.11); *Y02P 80/40* (2015.11)

Tetrahedral (Cont'd)1

Diamond Textile (Cont'd)2

(Cont'd)3

(Cont'd)4

(Cont'd)5

(Cont'd)6

(Cont'd)7

(Cont'd)8

(Cont'd)9

(Cont'd)10

LONG AND HIGH RESOLUTION STRUCTURES FORMED BY ADDITIVE MANUFACTURING TECHNIQUES

CROSS-REFERENCE TO RELATED PATENT APPLICATION

The present disclosure is part of a continuation of U.S. patent application Ser. No. 15/337,228, filed Oct. 28, 2016 and claiming the priority benefit of the below-listed provisional applications.

U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in their entirety.

TECHNICAL FIELD

The present disclosure generally relates to structures that can formed with high resolution and throughput using additive manufacturing applications. In one embodiment, high resolution structures such as internally supported airfoils with a substantial length are disclosed.

BACKGROUND

Additive manufacturing, also referred to as 3D printing, typically involves sequential layer by layer addition of material to build a part. Beginning with a 3D computer model, an additive manufacturing system can be used to create complex parts from a wide variety of materials. However, it is not practically possible to create any structure, part, or component. Additively manufactured structures are often limited in size, in feature resolution, and throughput time to manufacture. For example, a large and finely detailed part could take weeks or months to manufacture using conventional additive manufacturing systems.

Additive manufacturing machines today typically fall within certain bounds of operation with regards to material throughput $$\text{rate} - \dot{m}\left[\frac{g}{hr}\right],$$

largest part size $-Z[cm]$, and $$\text{resolution} - R\left[\frac{\text{features}}{mm}\right].$$

Characterization of additive manufacturing machine performance can involve calculation of several variables, including resolution to mass throughput rate, diagonal size of the print bed as compared to the printable resolution, or mass throughput rate as compared to the diagonal print bed. Part size and mass throughput can also be respectively calculated for additive manufacturing machines. Additive manufacturing machine typically are able to print either very large (>10 m) or very high throughput (>50 kg/hr) parts or structures, not both.

One additive manufacturing technique known as powder bed fusion (PBF) uses one or more focused energy sources, such as a laser or electron beam, to draw a pattern in a thin layer of powder by melting the powder and bonding it to the layer below. This technique is highly accurate and can typically achieve feature sizes as small as 150-300 um. However, powder bed fusion additive manufacturing machine manufacturers struggle to create machines that can produce printed material in excess of 1 kg/hr. Because of this slow powder-to-solid conversion rate, machine sizes are relatively small due to the length of time it would take to print larger parts. Today's largest machines have printable part volumes generally less than 64 L (40 cm)$^3$. While these printers are capable of printing parts of nearly arbitrary geometry, due to the high machine cost and low powder conversion rate the amortized cost of the machine ends up being very high, resulting in expensive parts.

Unfortunately, increasing part size or decreasing manufacturing costs by simply scaling-up the machine is not an acceptable solution. As a minimum, to melt a given volume of material the laser has to deliver both enough energy to bring it up to the melting temperature, and the phase change energy required to melt. If no thermal energy is dissipated in this process, then there is a linear scaling between laser energy deposited over time (laser power), and material throughput rate. If a powder bed fusion additive manufacturing machine maker wants to scale up in material throughput rate they would necessarily need to increase their laser power. This increase in laser power unfortunately increases proportionally with the cost of the laser, and a scale up greatly increases the cost of today's already expensive machines.

Even if laser costs were not a factor, power scaling a laser can have other detrimental effects. Every powdered material has optimum melting properties dependent on power flux. If power is too low, the powder doesn't melt, and if too high the laser can drill into the material (key-holing). Increasing the laser power of a machine already operating at one of these optimum points results necessarily requires an increase in laser area (spot size) to maintain the optimum power flux. Simply increasing the spot size degrades printable resolution, while dividing up the laser into multiple beams increases the system complexity.

In effect, currently available powder bed additive manufacturing machines can be limited in part size, part manufacturing cost, resolution of part details, and part manufacturing throughput.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1A:
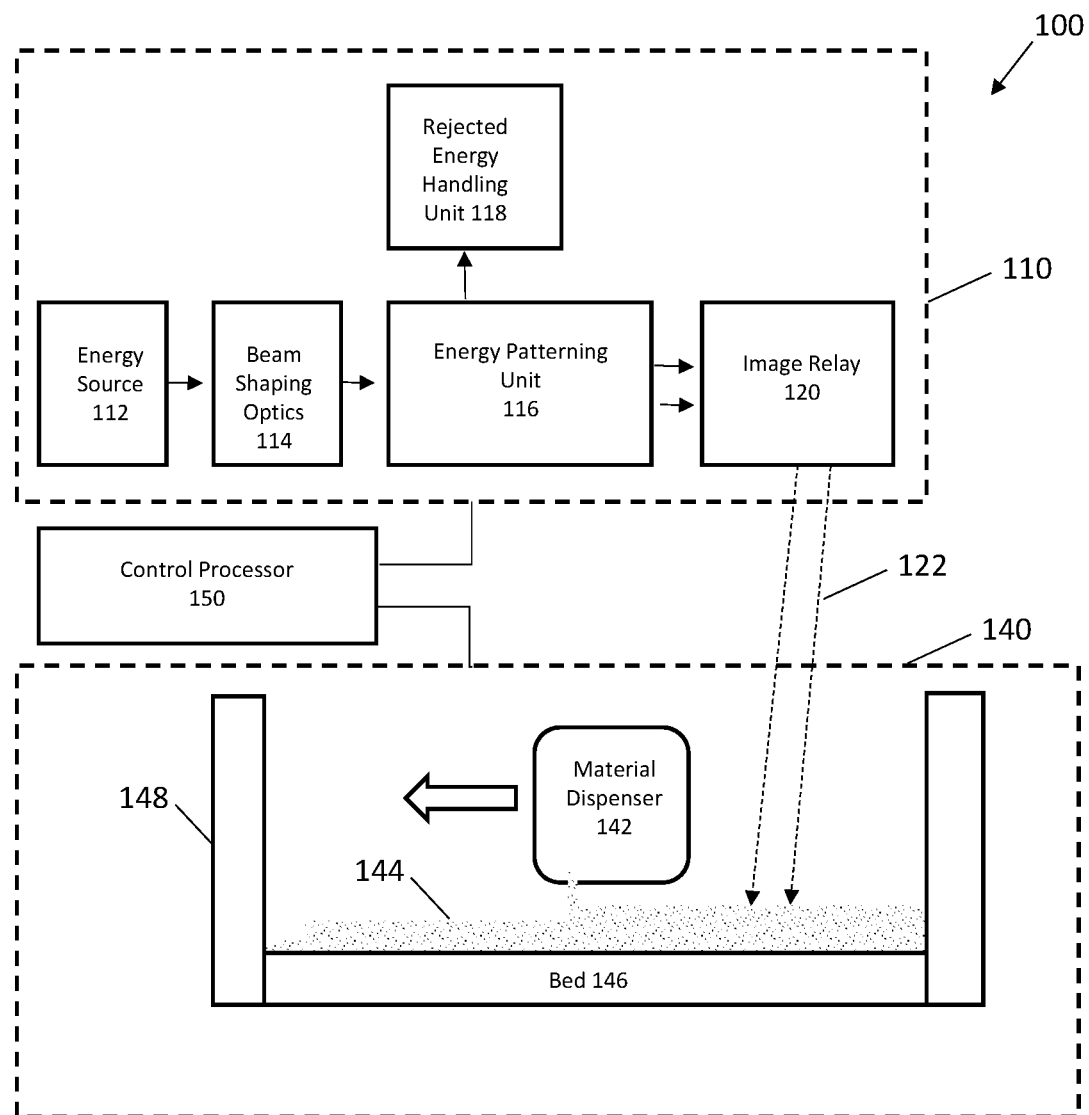
FIG. 1A illustrates an additive manufacturing system.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure discloses a method of additive manufacture suitable for large and high resolution structures. The method may include sequentially advancing each portion of a continuous part in the longitudinal direction from a first zone to a second zone. In the first zone, selected granules of a granular material may be amalgamated. In the second zone, unamalgamated granules of the granular material may be removed. The method may further include advancing a first portion of the continuous part from the second zone to a third zone while (1) a last portion of the continuous part is formed within the first zone and (2) the first portion is maintained in the same position in the lateral and transverse directions that the first portion occupied within the first zone and the second zone.

Another embodiment for manufacturing a long part includes providing a powder material and an energy source that can include single or multiple energy beams. The single or combined energy beam from the energy source is directed toward an energy patterning unit to form a two-dimensional patterned energy beam. This two-dimensional patterned energy beam is directed against the powder material to form a structure having a size greater than or equal 10 meters in length, calculated by $Z=f_4 (10)[m]$ where the scaling factors $\theta_4$ is selected to be greater than or equal to 1 and less than or equal to 5. The structure can be a frame, a truss, or a lattice structure.

An additive manufacturing system is disclosed which has one or more energy sources, including in one embodiment, one or more laser or electron beams, positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/MnC12) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:YVO4) laser, Neodymium doped yttrium calcium oxoborateNd:YCa4O(BO3)3 or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:2O3 (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass(147 Pm+3:Glass) solid-state laser, Chromium doped chrysoberyl (alexandrite) laser, Erbium doped anderbium-ytterbium co-doped glass lasers, Trivalent uranium doped calcium fluoride (U:CaF2) solid-state laser, Divalent samarium doped calcium fluoride(Sm:CaF2) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
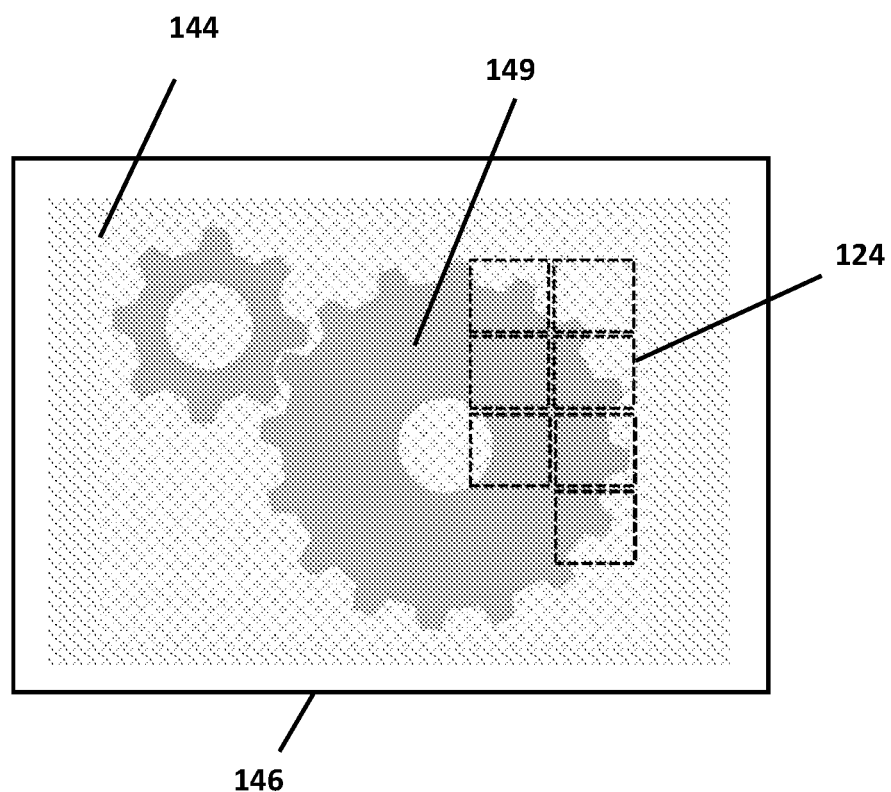
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
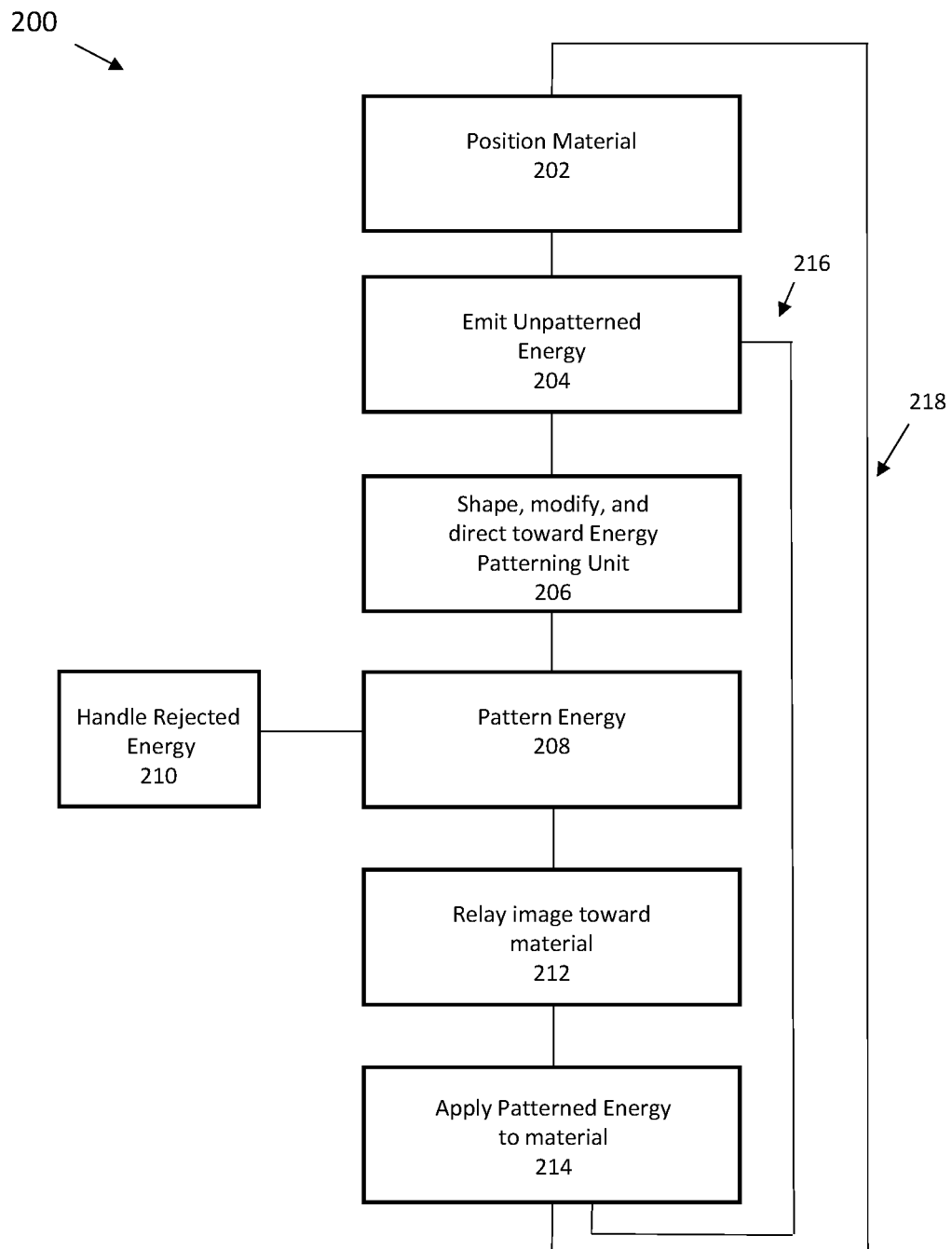
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
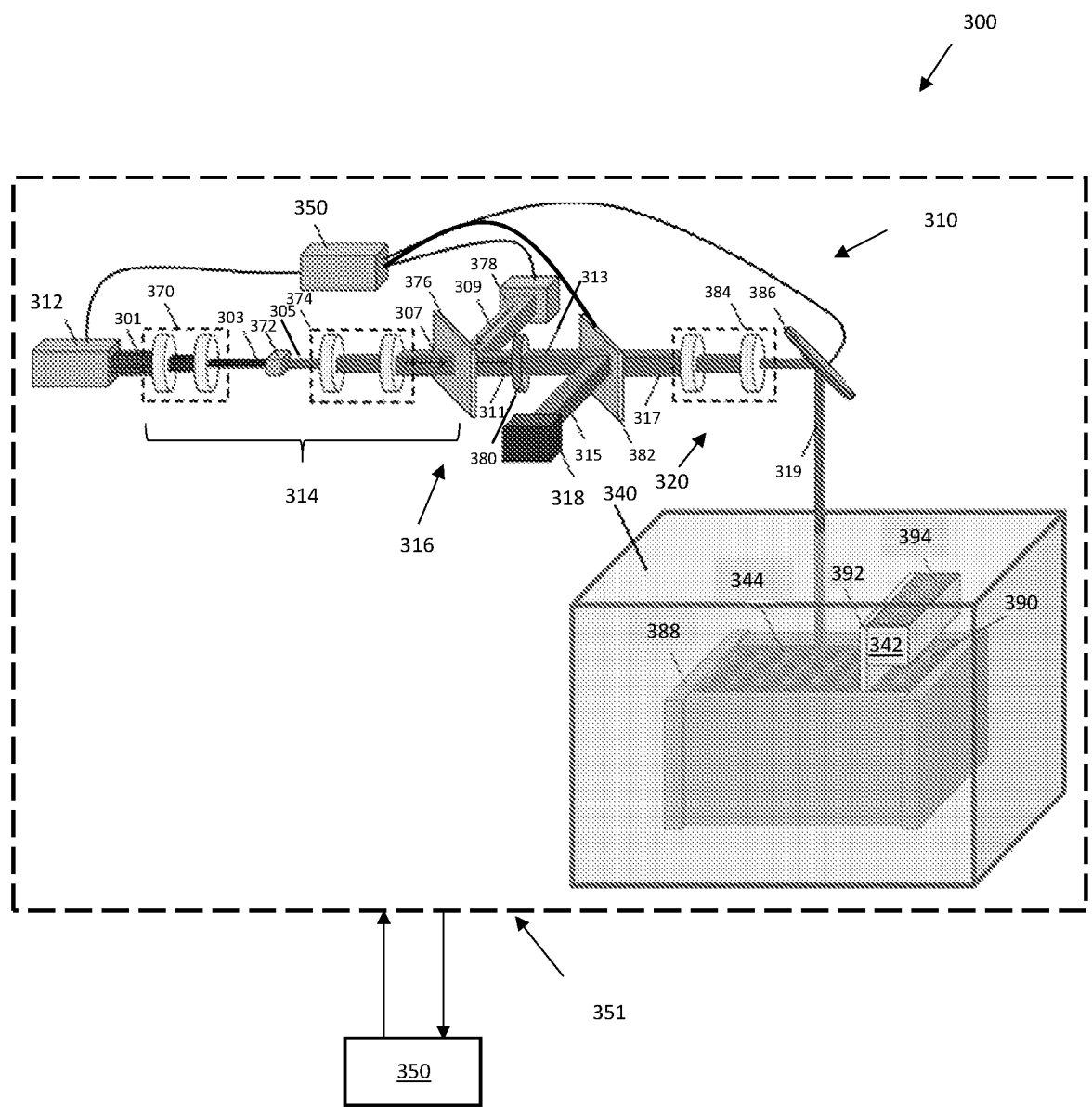
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
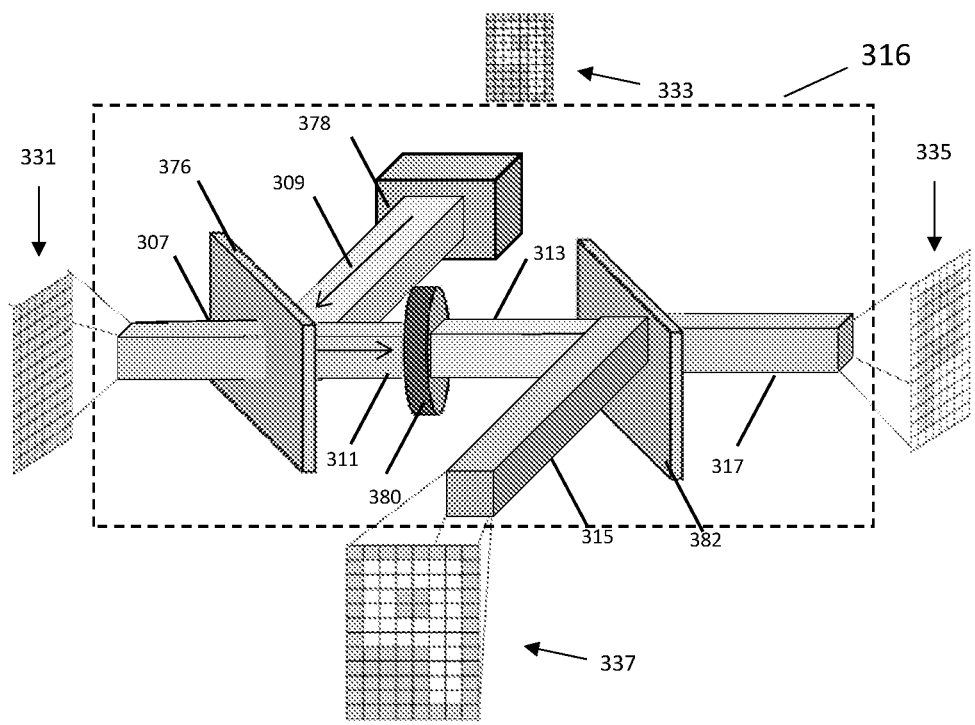
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
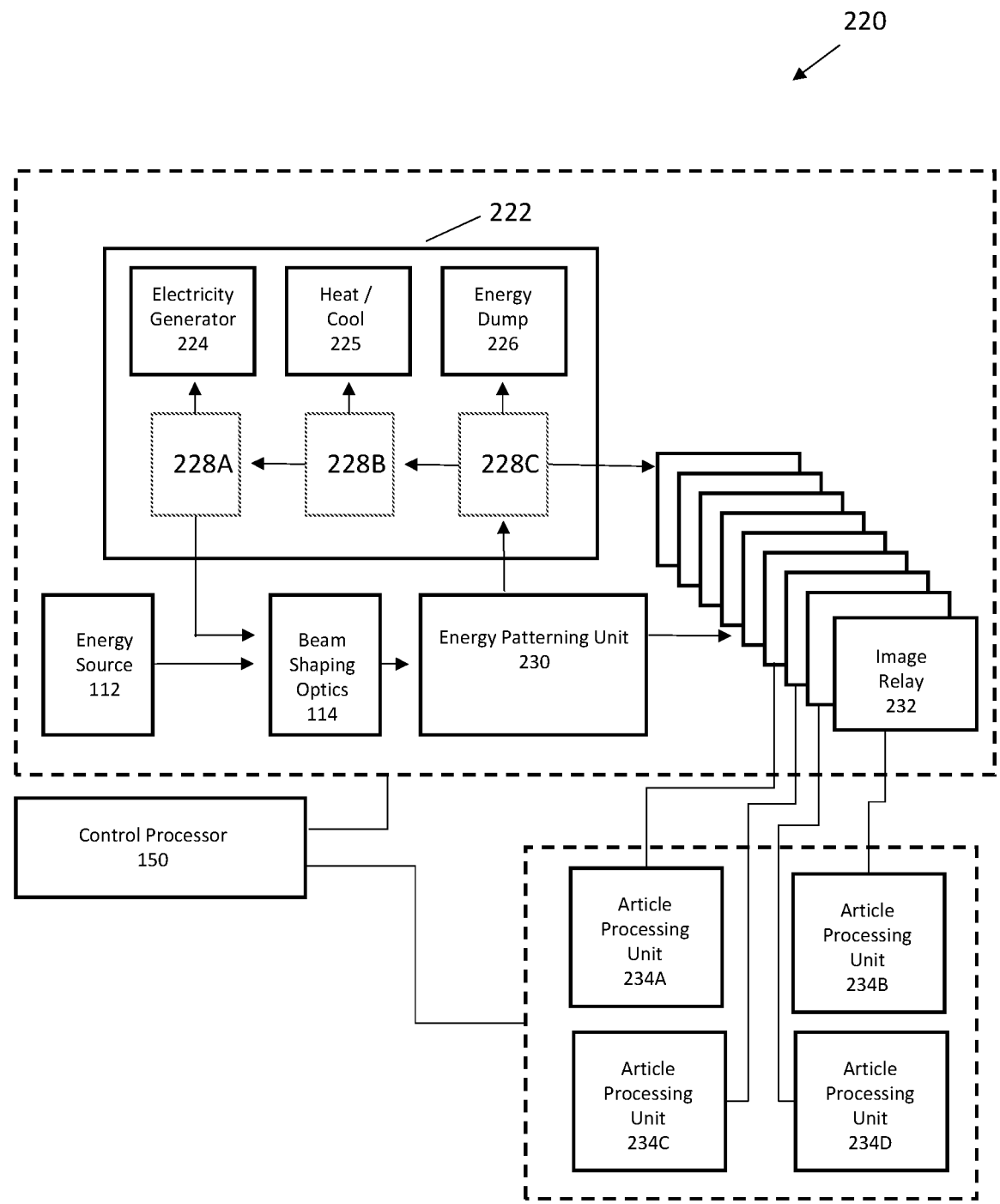
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser.

Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
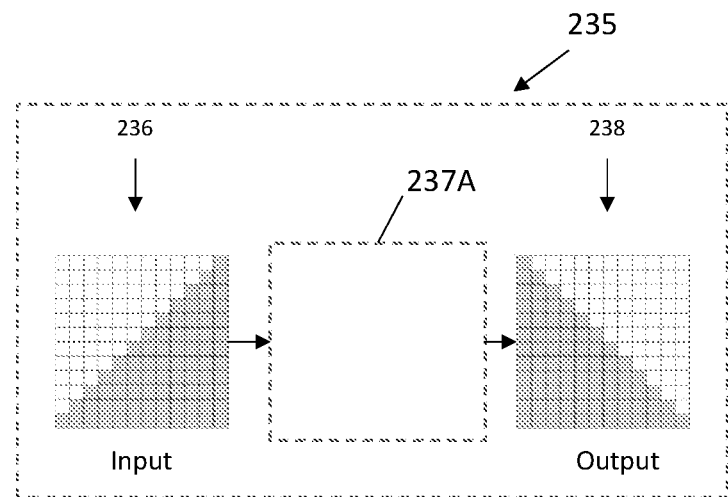
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
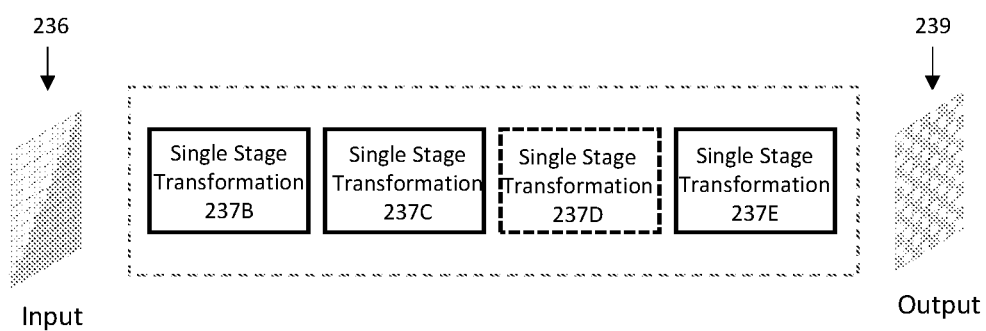
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
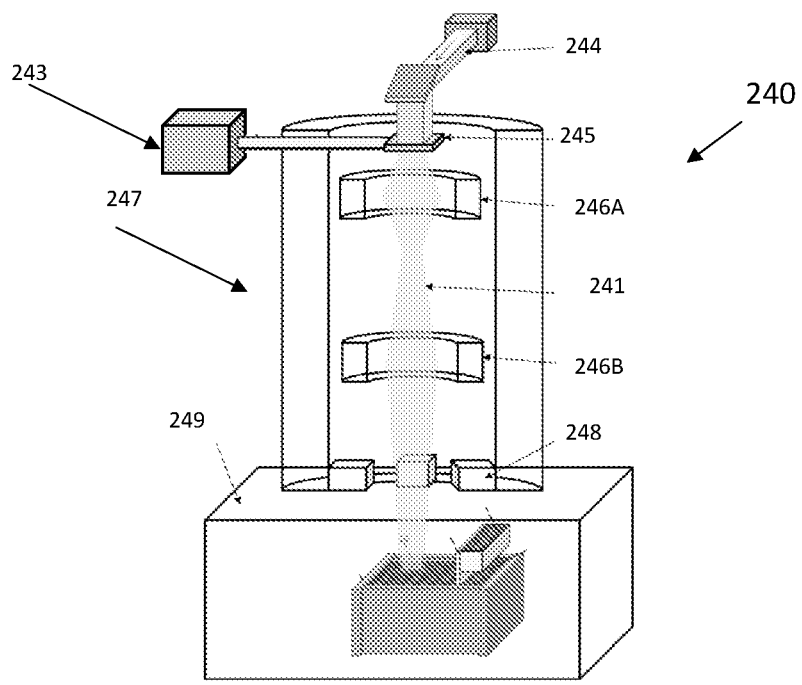
FIG. 3F illustrates an patternable electron energy beam additive manufacturing system.
Figure 3G:
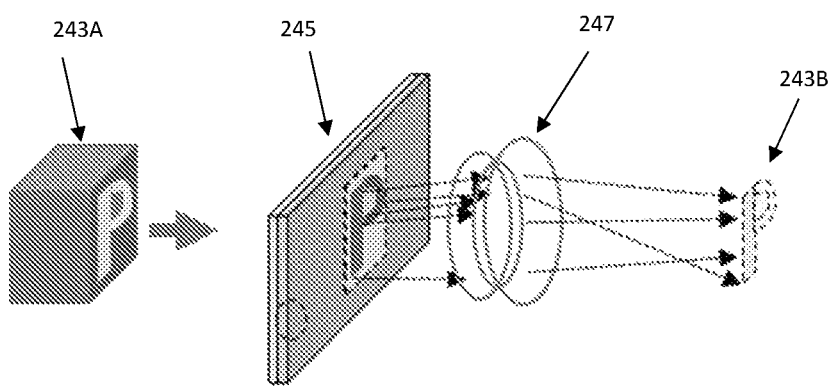
FIG. 3G illustrates a detailed description of the electron beam patterning unit shown in FIG. 3F.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials. Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

To aid better understanding and appreciation of the proposed systems and methods, non-limiting examples are provided in FIGS. 4-19. The following description refers to FIGS. 4-12.

Figure 4:
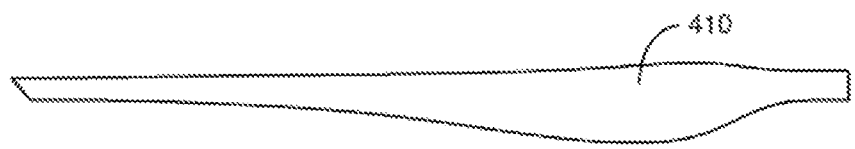
FIG. 4 is an illustration of a wind turbine blade that is an example of a long part that may be manufactured using systems and methods in accordance with the present invention.
Figure 5:
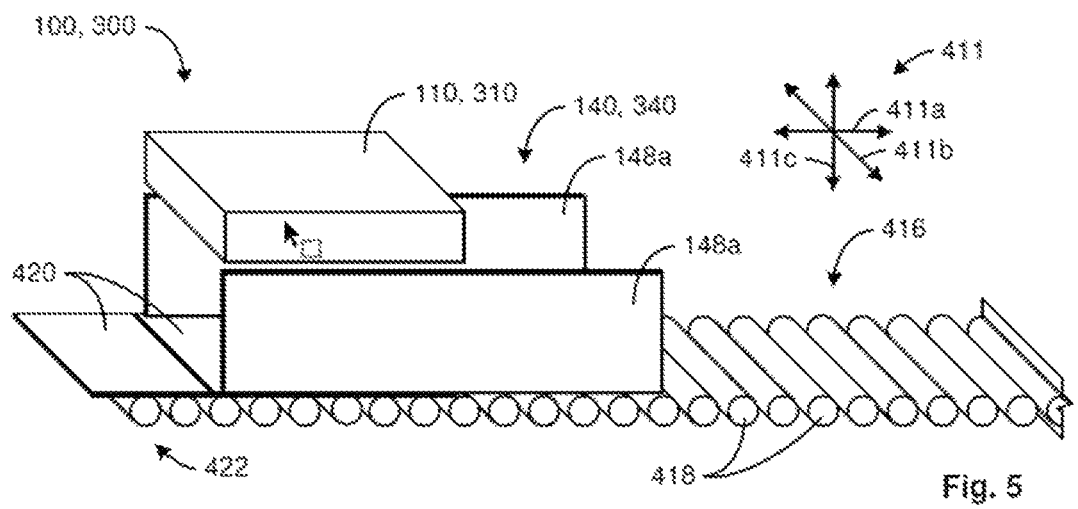
FIG. 5 is a perspective, schematic diagram of one embodiment of a system for additive manufacture in accordance with the present invention.
Figure 6:
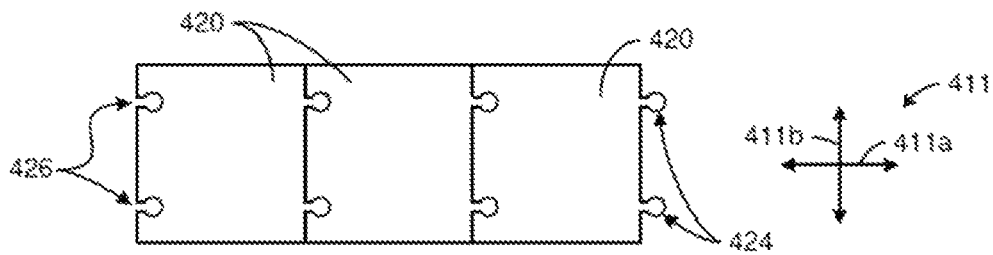
FIG. 6 is a top plan view of one embodiment of multiple plates that may be used to support a part on a conveyor in accordance with the present invention.
Figure 7:
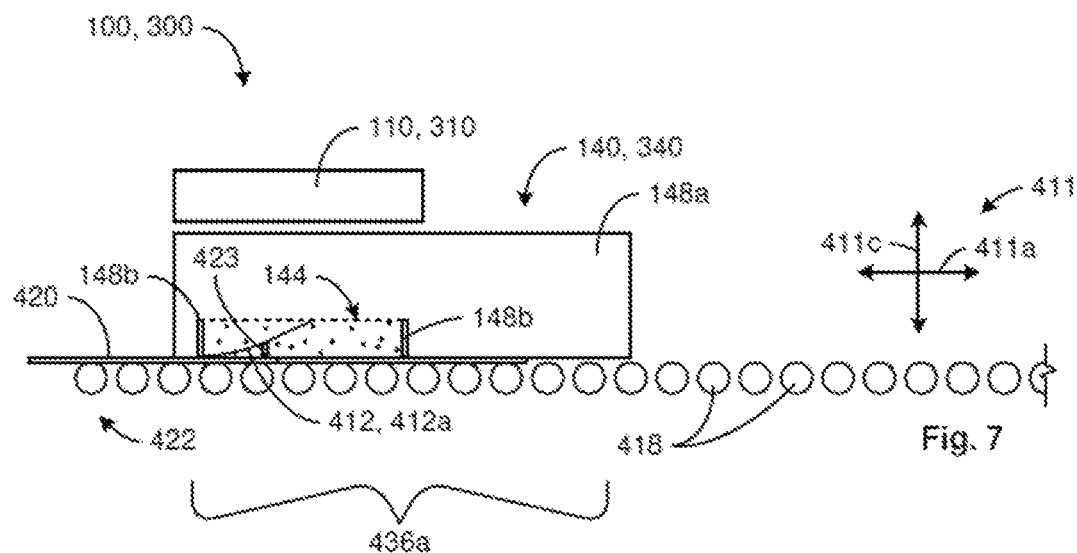
FIG. 7 is a side view of the system of FIG. 5 with a near side wall removed so that a long part in a first phase of manufacture may be seen.
Figure 8:
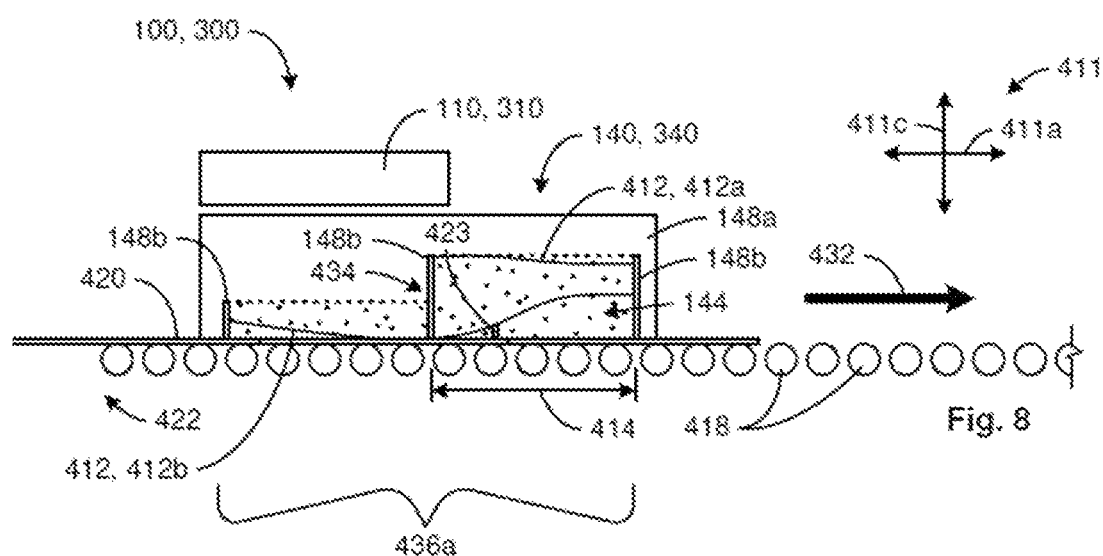
FIG. 8 is a side view of the system of FIG. 5 with a near side wall removed so that a long part in a second phase of manufacture may be seen.
Figure 9:
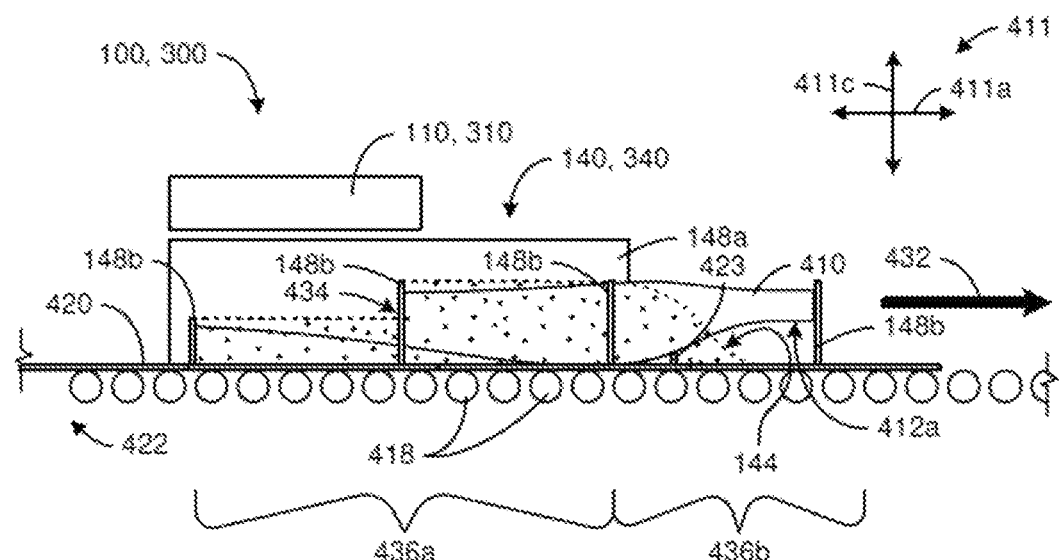
FIG. 9 is a side view of the system of FIG. 5 with a near side wall removed so that a long part in a third phase of manufacture may be seen.
Figure 10:
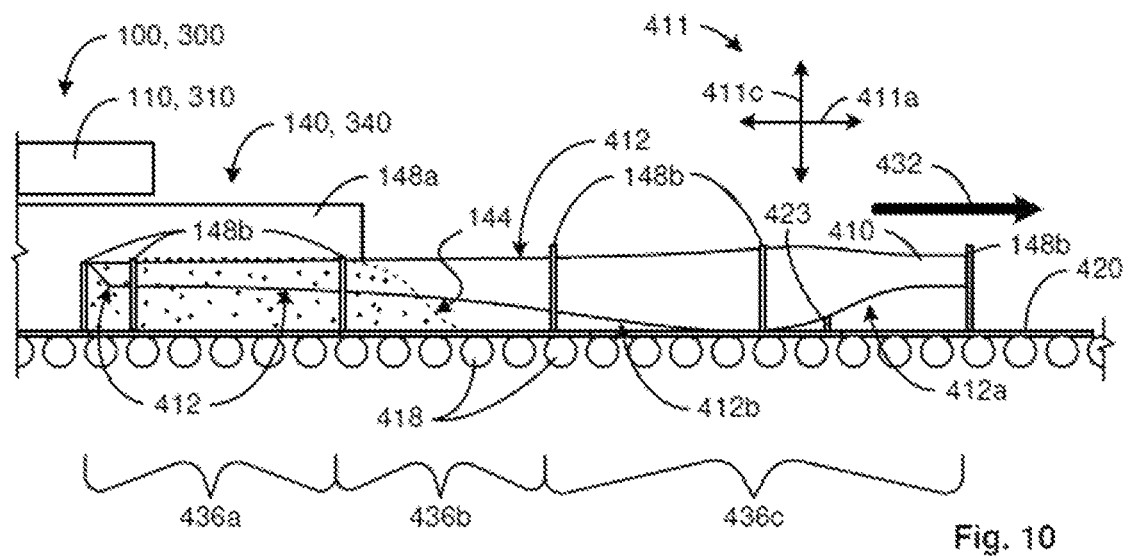
FIG. 10 is a side view of the system of FIG. 5 with a near side wall removed so that a long part in a final phase of manufacture may be seen.

Referring to FIG. 4, in selected embodiments, systems and methods in accordance with the present invention may enable or support the additive manufacture of parts 410 of arbitrarily length. Such parts 410 may take on various shapes and sizes. For example, a wind turbine blade is a long part 410 (e.g., 15 meters or longer) that may be formed using systems and methods in accordance with the present invention. Accordingly, various aspects of the present invention may be illustrated in conjunction with a wind turbine blade 410. However, it is to be understood that a wind turbine blade 410 is used herein by way of example, not by way of limitation. Systems and methods in accordance with the present invention may be used to manufacture a wide variety of long parts, short parts, etc.

Referring to FIGS. 5-10, in discussing certain systems 100, 300 in accordance with the present invention, it may be helpful to define a uniform coordinate system 411. Accordingly, certain systems 100, 300 may correspond to or define longitudinal, lateral, and transverse directions 411a, 411b, 411c that are orthogonal to one another. The longitudinal direction 411a may correspond to a long axis of a system 100, 300. Accordingly, during additive manufacture, a long axis of a long part 410 may be substantially aligned with the longitudinal direction 411a. The lateral direction 411b may combine with the longitudinal direction 411a to define a horizontal plane. That is, the longitudinal and lateral directions may both extend within a horizontal plane. The transverse direction 411b may extend up and down in alignment with gravity.

Many current 3D printers have significant and recurrent downtime when a build chamber must be emptied of powder and printed parts and reset for the next print job. In selected embodiments, systems and methods in accordance with the present invention may enable or support substantially continuous additive manufacture that does not have such downtime. This may be accomplished by manufacturing a part 410 in segments 412.

For example, in selected embodiments, a system 100, 300 in accordance with the present invention may (1) manufacture a first segment 412a of a part 410, (2) advance the part 410 a selected distance 414 down a conveyor 416, (3) manufacture a second segment 412b of the part 410, (4) advance the part 410 a selected distance 414 down the conveyor 416, and (5) repeat until all segments 412 of the part 410 have been completed. In this manner, additive manufacture and clean-up (e.g., separation and/or reclamation of unused or unamalgamated granular material 144) may be performed in parallel (i.e., at the same time) at different locations or zones on the conveyor 416. Thus, additive manufacture in accordance with the present invention need not stop for removal of granular material 144 and/or parts.

A system 100, 300 or selected components thereof may be contained within an enclosure. Such an enclosure may control one or more environmental conditions as desired or necessary. For example, in embodiments involving certain metal powders that may be chemically sensitive to the presence of oxygen or oxygen containing compounds, an enclosure may enable or provide an oxygen free or low oxygen environmental chamber. In selected embodiments, this may be accomplished by filling a gas-tight enclosure with substantially exclusively argon gas such that oxygen levels are at about ten parts per million or less. Accordingly, an enclosure may prevent or lower the risk of contamination due to oxidation and/or explosion due to an increased reactivity of powdered materials. In certain embodiments, all of the various zones of a conveyor 416 may be contained within such an enclosure (e.g., within a single enclosure).

In selected embodiments, a bed 146 may form part of, be supported by, and/or ride on a conveyor 416. A conveyor 416 may have any suitable configuration. For example, in certain embodiments, a conveyor 416 may comprise one or more powered rollers 418 that rotate as directed by a controller 150. Alternatively, a conveyor 416 may comprise a belt extending around a plurality of rollers 418, one or more of which may be powered and rotate as directed by a controller 150.

Regardless of the configuration of a conveyor 416, an energy patterning system 110, 310 or selected components thereof may be configured to move incrementally in the transverse direction 411c with respect to the conveyor 416.

That is, a system 100, 300 may utilize or employ a bed 146 that is fixed in the lateral and transverse directions 411b, 411c and a "print" head that indexes (e.g., incrementally moves) in the transverse direction 411c to change the focal point to accommodate new (i.e., higher) layers of material as they are laid down on the bed 146.

In certain embodiments, a bed 146 may be a top portion of a conveyor 416 (e.g., a portion of a segmented belt comprising a plurality of substantially rigid pieces pivotably connected to one another and riding on top of one or more rollers 418). Alternatively, a bed 146 may comprise one or more planar structures 420 that rest on top of a conveyor 416. For example, a bed 146 may comprise one or more plates 420 that are individually introduced at an inlet end 422 of a conveyor 416.

In certain embodiments, each plate 420 may be sized to accommodate or support the longest distance a system 100, 300 can "print" at one time. Alternatively, each plate 420 (or at least certain plates 420) may be longer or shorter than that longest distance. In selected embodiments, embodiment, each plate 420 may be about 1 to about 5 meters long in the longitudinal direction 411a and about 1 to about 6 meters wide in the lateral direction 411b.

In selected embodiments, one or more plates 420 may form a platform to which one or more parts 410 are bonded during a process of additive manufacture. For example, one or more areas of a part 410 may be formed to be in direct contact with one or more plates 420. Such areas may be bonded (e.g., fused, welded, etc.) to those plates 420 in order to substantially rigidly support the rest of a part 410 during a process of additive manufacture. Accordingly, the material of one or more plates 420 may be selected to support such bonding.

For example, if the part 410 is formed of a polymeric material, the plates 420 may be formed of a polymeric material (e.g., the same polymeric material) or some other material that the polymeric material may sufficiently grip. If the part 410 is formed of metal or metal alloy, the plates 420 may be formed of a metal or metal alloy (e.g., the same metal or metal alloy) or some other material that the metal or metal alloy may sufficiently grip. Once a process of additive manufacture is complete, a part 410 may be removed from the plates 420. Accordingly, the plates 420 may be used in the manufacture of other parts 410.

In addition to directly bonding areas of a part 410 to one or more plates 420, one or more temporary structures 423 may be formed to support a part 410 during manufacture. For example, one or more temporary structures 423 may be created in the same process of additive manufacture as the part 410 they support. The temporary structures 423 may extend from one or more plates 420 to one or more areas on a part 410.

In certain embodiments, one or more temporary structures 423 may be bonded (e.g., fused, welded, etc.) to the plates 420 and to the part 410 in order to substantially rigidly support the part 410 during the rest of a process of additive manufacture. Accordingly, the material of one or more plates 420 may be selected to support such bonding. Once a process of additive manufacture is complete, the temporary structures 423 may be removed (e.g., broken off, cut off, ground off, or the like) from the part 410 and plates 420. Accordingly, the plates 420 may be used in the manufacture of other parts 410.

In selected embodiments, one or more plates 420 may securely attach to a conveyor 416 and/or to each other to form a stable platform for supporting one or more long parts 410 during a process of additive manufacture. That is, one or more long parts may span more than one plate 420. Accordingly, movement (e.g., translation, rotation, or combinations thereof) of one plate 420 with respect to an adjacent plate 420 may cause distortions or errors in a part 410 spanning those plates 420. Thus, to minimize those distortions or errors, plates 420 may securely attach to a conveyor 416 and/or to each other.

For example, in certain embodiments, each plate 420 may be configured to mechanically engage one or more adjacent plates 420. This may involve certain extensions 424 engaging certain complementary apertures 426, certain pins engaging certain holes, one or more threaded fasteners, or the like or a combination or sub-combination thereof. Alternatively, or on addition thereto, a process of additive manufacture may be used to connect a plate 420 to one or more plates 420 adjacent thereto.

For example, a system 100, 300, may identify one or more seams between plates 420 and generate via additive manufacture one or more bridges or linking structures that span those seams to more rigidly connect one plate 420 to another. In certain embodiments, additive manufacture performed by a system 100, 300 in accordance with the present invention may seal all the joints between adjacent plates 420, thereby preventing any separation that would allow a granular material 144 forming the basis of the additive manufacture to fall therethrough.

In selected embodiments, a process of additive manufacture in accordance with the present invention may involve the amalgamation (e.g., the melting, sintering, fusing, or otherwise uniting) of selected granules of a granular material 144. The amalgamation may be the result of directing radiant energy at the selected granules. Accordingly, for each layer of granular material 144, only the selected granules to which radiant energy is directed may, through amalgamation, form the structures (e.g., parts 410, temporary structures 423, etc.) that are manufactured.

As a granular material 144 is laid down, layer after layer, it may be necessary to contain the granular material 144 so that is does not move, shift, fall away from a part 410, or the like during additive manufacture. Accordingly, a system 100, 300 in accordance with the present invention may include one or more walls 148. Certain walls 148a may be stationary. That is, they may not move with a conveyor 416. Other walls 148 may be traveling walls 148b that move with a conveyor 416. For example, in selected embodiments, two stationary walls 148a may block granular material 144 from falling off the sides of a conveyor 416 in a lateral direction 411b, while two or more traveling walls 148b may contain the granular material 144 in the longitudinal direction 411a.

In selected embodiments, certain stationary walls 148a may extend in the longitudinal direction 411a along opposite sides of a conveyor 416. Such stationary side walls 148a may have any suitable size. In certain embodiments, stationary side walls 148a may have a length in the longitudinal direction 411a of about 2 to about 18 meters and a height in the transverse direction 411c of about 0.5 meters to about 3 meters.

Both such stationary side walls 148a may extend along a subset of the overall length of a conveyor 416 in the longitudinal direction 411a. This may allow access for one or more plates 420 to be added proximate an inlet 422 of a conveyor 416 and for granular material 144, parts 410, and plates 420 to be removed from the conveyor 416 at the other end thereof. The height of the stationary side walls 148a above the plates 420 may define the maximum height (i.e., the maximum dimension in the transverse direction 411c) of the parts 410 that can be manufactured in the corresponding system 100, 300.

In other embodiments, one or more stationary walls 148a may be omitted. In such embodiments, the retaining or containing of granular material 144 that would have been performed by an omitted stationary wall 148a may be performed by a traveling wall 148b. For example, a particular section 412 of a part 410 may be bounded in the longitudinal and/or lateral directions 411a, 411b by traveling walls 148b.

Traveling walls 148b may be formed in any suitable manner. In selected embodiments, one or more traveling walls 148b may be prefabricated. Accordingly, they may be placed on a plate 420 and secured in place (e.g., via spot welding) before a first layer of granular material 144 is laid down. If desired, certain prefabricated traveling walls 148b (e.g., traveling walls 148b that extending in the lateral direction 411b across a plate 420) may be incorporated within (e.g., extend across) a part 410. Alternatively, or in addition thereto, one or more traveling walls 148b may be manufactured with the part 410 in a process of additive manufacture. That is, one or more traveling walls 148b may be formed with a part 410 in a process of additive manufacture. Thus, one or more traveling walls 148b may "grow" with an adjacent section 412 of a part 410.

In selected embodiments, in addition to retaining or containing granular material 144, one or more traveling walls 148b may be or function as temporary structures 423. That is, one or more traveling walls 148b may be bonded (e.g., fused, welded, etc.) to one or more plates 420 and to one or more parts 410 in order to substantially rigidly support the one or more parts 410 during the process of additive manufacture.

In selected embodiments, one or more traveling walls 148b may be included as part of one or more plates 420 or may comprise separate structures (e.g., vertical plates) that are spot welded or otherwise temporarily fastened to one or more plates 420 riding on a conveyor 416. For example, as one or more plates 420 are placed on a conveyor 416, one or more preformed traveling side walls 148b may be spot welded or otherwise connected to those plates 420 to contain granular material in the lateral direction 411b. Accordingly, like the plates 420, certain preformed traveling side walls 148b may be removed, cleaned up, and reused.

In certain embodiments, a system 100, 300 in accordance with the present invention may manufacture one or more long parts 410 in segments 412. Accordingly, a system 100, 300 may manufacture a first segment 412a of a part 410 in a first process of additive manufacture, manufacture a second segment 412b of the part 410 in a second process of additive manufacture, and so forth until all segments 412 of the part 410 have been completed. In selected embodiments, a segment 412 of a part 410 may comprise a section of the part 410 that extends a distance in the longitudinal direction 411a less than an overall length of the part 410 in the longitudinal direction 411a. Accordingly, a process of additive manufacture used to create a segment 412 may include distributing one or more layers of granular material 144 and amalgamating selected granules within each of those layers.

A segment 412 may have any suitable length in the longitudinal direction 411a. The range of suitable lengths may extend from a maximum corresponding to the longest distance a system 100, 300 can "print" at one time to a shortest distance the system 100, 300 can print at one time. In selected embodiments, the segments 412 corresponding to a particular part 410 may be of uniform length in the longitudinal direction 411a. Alternatively, certain segments 412 may be longer than others. For example, for a particular part 410, certain segments 412 may be equal to a longest distance a system 100, 300 can "print" at one time, while a last segment 412 may be shorter to just accommodate the remaining length of the part 410.

Once the additive manufacture of a particular segment 412 of a part 410 is complete, a "print" head of an energy patterning system 110, 310 may move out of the way as needed and a conveyor 416 may translate 432 the segment 412 (and corresponding walls 148b, temporary structures 423, and unamalgamated granular material) in the longitudinal direction 411a. This translation 432 in the longitudinal direction 411a may be accomplished without moving the segment 412 (or corresponding walls 148b and temporary structures 423) in the lateral direction 411b or the transverse direction 411c and without rotating the same in any way. Thus, the movement induced by a conveyor 416 may be substantially exclusively translation 432 in the longitudinal direction 411a.

After such translation 432, a traveling wall 148b (e.g., a traveling wall 148b extending across a conveyor 416 in the lateral direction 411b) that was closest to an inlet 422 of a conveyor 416 may now be at or near a far end of the print range of an energy patterning system 110, 310. Accordingly, a new process of additive manufacture may have a "clean slate" to begin creating the next segment 412 of the part 410. This new process may include amalgamating selected granules to a near or trailing side 434 of a traveling wall 148b, thereby maintaining the longitudinal continuity (i.e., the continuous structural connection in the lateral direction 411a between a segment 412 that is currently being formed all previously formed segments 412) of the part 410.

Thus, certain traveling walls 148b may form the boundaries between the various segments 412 of a part 410. Such walls 148b may intersect any part 410 that spans them. Accordingly, before a part 410 is ready to use, selected portions of such walls 148b may need to be removed (e.g., broken off, cut off, ground off, or the like) from the part 410. Similarly, before a plate 420 is ready to be reused, selected portions of such walls 148b may need to be removed (e.g., broken off, cut off, ground off, or the like) from the plate 420.

A system 100, 300, in accordance with the present invention may define or include multiple zones 436. Different tasks may be performed in different zones 436. In selected embodiments, different zones 436 may correspond to different locations along a conveyor 416. Accordingly, a conveyor 416 may advance (e.g., translate 432) a part 410 through the various zones 436 of a system 100, 300.

In certain embodiments, a system 100, 300 may include three zones 436a, 436b, 436c. A first zone 436a may correspond to, include, or span the portion of a conveyor 416 where additive manufacture occurs. Thus, a first zone 436a may correspond to the area on a conveyor 416 where the various layers of granular material 144 are being laid down and granular material 144 is being maintained in intimate contact with a part 410.

A second zone 436b may directly follow a first zone 436a. A second zone 436b may be characterized by a significant portion of the unamalgamated portion of a granular material 144 moving away from a part 410. For example, in a second zone 436b, one or more walls 148 may terminate or be removed so that the unamalgamated portion of a granular material 144 may no longer be fully contained in the lateral direction 411b. As a result, some of the unamalgamated portion of a granular material 144 may spill off the sides of one or more plates 420, a conveyor 416, or the like. The spilling granular material 144 may fall into one or more containers where it may be collected and reused.

In certain embodiments, some of the unamalgamated portion of a granular material 144 may not "drain" off of a conveyor 416. Accordingly, within a second zone 436b, this remainder of the granular material 144 may be removed, cleaned-up, or the like in any suitable manner. For example, a vacuum mechanism having a collection port that is controlled (e.g., moved) manually or robotically may be used to collect the remainder. Alternatively, or in addition thereto, one or more flows of pressurized gas that are controlled (e.g., aimed) manually or robotically may be used to dislodge the remainder from certain crevices, sweep the remainder off a conveyor 416, and/or move the remainder to one or more locations where it can be accessed by a vacuum.

A third zone 436c may directly follow a second zone 436b. A third zone 436c may be characterized by a portion of a part 410 within the third zone 436c being exposed to view (e.g., completely, substantially, or partially exposed to view by the removal or movement of a significant portion of the unamalgamated portion of a granular material 144) without the part 410 changing its position in the lateral and transverse directions 411b, 411c.

For example, in certain embodiments, a leading portion of a part 410 may reach a third zone 436c while a trailing portion of the part 410 is still being manufactured within the first zone 436a. Accordingly, in selected embodiments, a conveyor 416, one or more plates 420, one or more temporary supports 423, one or more walls 148b, or the like or a combination or sub-combination thereof may cooperating to maintain a leading portion of a part 410 in the same position in the lateral and transverse directions 411a, 411c as the leading portion occupied within the first zone 436a and the second zone 436b. Thus, the position of the leading portion of the part 410 may not excessively disrupt, distort, or the like additive manufacture that is occurring on a trailing portion of the part 410 in the first zone 436a.

In selected embodiments, all of the unamalgamated portion of a granular material 144 that is external to a part 410 may be removed in the second zone 436b or within some combination of the second and third zones 436b, 436c. However, in certain alternative embodiments, a bed 146 may be removed from a conveyor 416 with four walls 148b intact. Accordingly, all or some remainder of the unamalgamated portion of a granular material 144 may be removed at a station that is spaced some distance from a first zone 436a.

In still other alternatively embodiments, a bed 146 may remain fixed to a conveyor 416 and flip upside down as certain portions of the conveyor 416 return toward an inlet 422. This motion may cause any remaining unamalgamated portion of a granular material 144 to fall into one or more containers where it may be collected and reused. If desired or necessary, one or more portions of the bed 146 (e.g., one or more plates 420) may be removed from the conveyor 416 before returning to the inlet 422.

Once a part 410 is complete (and, in selected embodiments, all the unamalgamated portion of a granular material 144 has been removed from the exterior of the part 410), the part 410 may be removed from one or more plates 420 by cutting with a mechanical saw, cutting with a torch, plasma cutter, or laser cutter, drilling, executing an electrical discharge machining (EDM) process, or the like or some combination thereof. Thereafter, the part 410 and one or more plates 420 may be cleaned-up and prepared for use and reuse, respectively.

Figure 11:
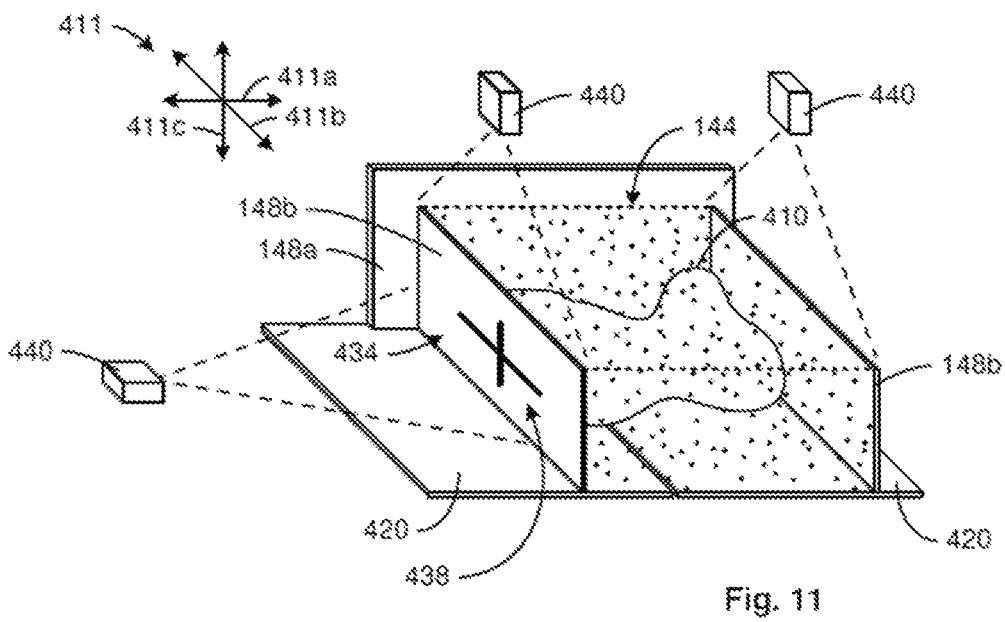
FIG. 11 is a perspective, schematic diagram of a portion of an alternative embodiment of a system for additive manufacture in accordance with the present invention with a near side wall removed so that a part in a particular phase of manufacture may be seen.

Referring to FIG. 11, if a part 410 is long and extends across multiple plates 420, certain deviances in the relative position of the plates 420 may cause corresponding segments 412 of the part 410 to be slightly misaligned with other segments of the part 410. Such deviances may be caused by changes in the relative position of one or more plates 420, flexing of one or more plates 420, failing (e.g., by a conveyor 416) to maintain a perfect alignment and/or exclusively longitudinal translation 432, failing (e.g., by a conveyor 416) to advance a just-completed segment 412 of a part 410 a precise distance 414, or the like or a combination or sub-combination thereof. As a result, after completing the manufacture of a particular segment 412 of a part 410 and advancing the completed segment 412 on the conveyor 416, deviances (e.g., accumulated error) may arise between where a system 100, 300 "thinks" that a part 410 is located and where the part 410 is actually located.

In selected embodiments, these deviances and the resulting misalignments may be sufficiently small so as to be accommodated with the dimensional tolerances of the part 410. In other embodiments, certain measures may be taken to detect deviances and implement corrections therefor while a part 410 is being manufactured. Such measures may be particularly helpful in the manufacture of long parts where accumulated error may otherwise cause a part 410 to depart from acceptable tolerances.

In certain embodiments, preventing deviances may include determining the actual location and/or orientation of a part 410 after every advance of the part 410 on the conveyor 416. This may be accomplished in any suitable manner. For example, if an intersecting wall 148b (e.g., a traveling wall 148b that extends in the lateral direction 411b through a part 410) is created in a process of additive manufacture with a corresponding segment 412 of a part 410, then the intersection points between the intersecting wall 148b and the part 410 may be precisely known by a system 100, 300. Accordingly, to ensure that a next, adjacent segment 412 will correctly align with the just completed segment 412, a feature map 438 (e.g., an optical test pattern) may be created in the intersecting wall 148b (e.g., the process of additive manufacture may incorporate a feature map 438 within an intersecting wall 148b). Thus, after an advance of the selected distance 414, one or more optical sensors 440 (e.g., one or more cameras) may be used to locate one or more features of the feature map 438 in order to exactly determine the current location of the part 410.

That is, since the system 100, 300 printed the feature map 438, the system 100, 300 may know precisely how the one or more features of the feature map 438 relate to the orientation of the part 410. Accordingly, by measuring the post-advance position of the one or more features of a feature map 438, a system 100, 300 may know a current position of the part 410. Based on that measuring, one or more corrections to the location and/or orientation of the next segment 412 may be made and implemented. Thus, to combat accumulated error, the new segment 412 may be located and/or oriented based on actual measurements taken from one or more features precisely linked in three-dimensional space to the just-completed segment 412.

In selected alternative embodiments where one or more traveling walls 148b are prefabricated, both sides of the one or more walls 148b may contain a feature map 438. Accordingly, as one segment 412 is created proximate one side of a wall 148b, an optical system 440 may monitor the progress and record the exact attachment points to the wall 148b. Thus, when a subsequent segment 412 is created proximate an opposite side of the wall, the alignment information previously collected may be used to precisely link in three-dimensional space the new segment 412 to the just-completed segment 412.

In selected embodiments, one or more optical sensors 440 may be positioned so as to have an unobstructed view of a feature map 438. For example, one or more optical sensors 440 may be positioned proximate an inlet 422 and may point in the longitudinal direction 411a toward an exposed or trailing face 434 of a traveling wall 148b. Alternatively, or in addition thereto, one or more optical sensors 440 may be positioned above a first zone 436a and may point in the transverse direction 411c toward a top edge of one or more traveling walls 148b.

For one or more traveling walls 148b and selected feature maps 438 or edges thereof, one or more optical sensors 440 in accordance with the present invention may be configured and positioned to detect position of in the longitudinal direction 411a, position in the lateral direction 411b, position in the transverse direction 411c, rotation about an axis extending in the longitudinal direction 411a, rotation about an axis extending in the lateral direction 411b, rotation about an axis extending in the transverse direction 411c, or the like or a combination or sub-combination thereof.

Figure 12:
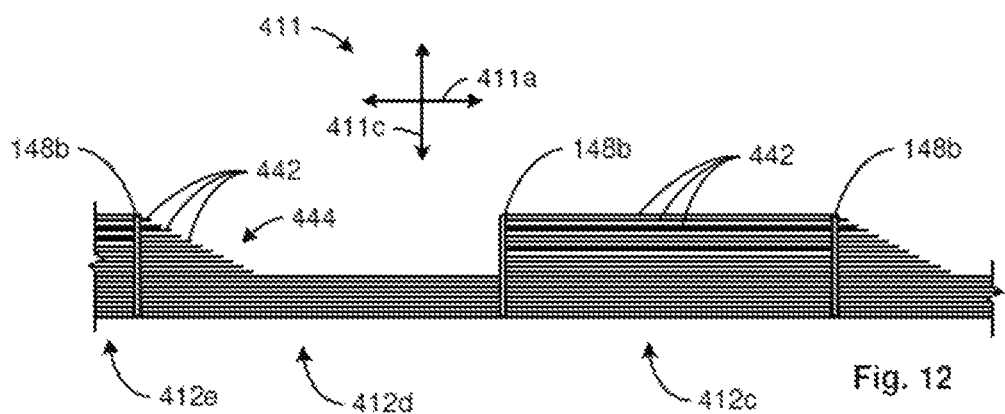
FIG. 12 is a schematic diagram showing various layers of granular material that may be laid down in the formation of the different segments of a long part.

Referring to FIG. 12, in selected embodiments, the portions of one or more parts 410 corresponding to one segment 412c may be taller in the transverse direction 411c than the portions of one or more parts 410 corresponding to another segment 412d. Accordingly, more layers 442 of granular material 144 may be laid down for the one segment 412c than the other 412d. Thus, the number of layers 442 need not be equal between segments 412.

In certain embodiments, a ramp 444 may be used to transition from a lower segment 412d to a subsequent, higher segment 412e. For example, a ramp 444 may enable a trailing wall 148b corresponding to a lower segment 412d to be built up higher by a process of additive manufacture than the majority of the lower segment 412d so that the trailing wall 148b can become a leading wall 148b for a subsequent, higher segment 412e. Building a ramp 444 may be much faster than laying down complete layers 442 (e.g., layers 442 covering the entire lower segment 412d) when only the trailing wall 148b is being built up.

A ramp 444 may include a plurality of layers 442 of granular material 144 whose length in one or more directions (e.g., the longitudinal direction 411a) is incrementally changed. For example, within a ramp 444, each successive layer 442 may be shorter in length than the immediately preceding layer 442. The resulting angle of a ramp 444 with respect to the horizontal may be less than a critical angle of repose for the granular material 144. Accordingly, the granular material 144 forming the ramp 444 may be stable and not slough off or move due to the acceleration of gravity acting thereon.

Figure 13:
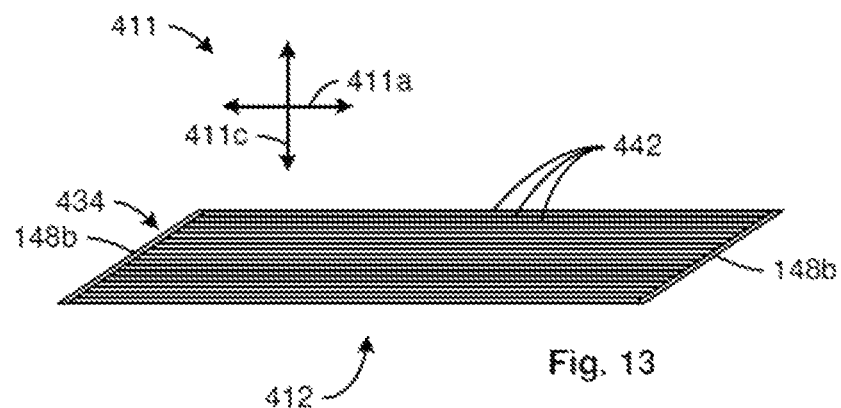
FIG. 13 is a schematic diagram showing various layers of granular material that may be laid down in the formation of a segment of a long part, wherein the traveling walls corresponding to the segment extend at an acute angle with respect to the horizontal.

Referring to FIG. 13, in selected embodiments, one or more traveling walls 148b may extend substantially vertically. In other embodiments, one or more traveling walls 148b may extend at an angle with respect to the horizontal that is less then ninety degrees. In certain embodiments, the angle of a wall 148 with respect to the horizontal may be selected to improve access to a trailing surface 434 of the traveling walls 148b. That is, a just completed traveling wall 148b (e.g., a leading traveling wall 148b of a new segment 412) may slope away from a "print" head of an energy patterning system 110, 310 and/or a dispenser or distributor 142 of granular material 144 so that the energy patterning system 110, 310 and/or the dispenser or distributor 142 of granular material 144 may have better access to the traveling wall 148b as the next segment 412 is manufactured.

Figure 14:
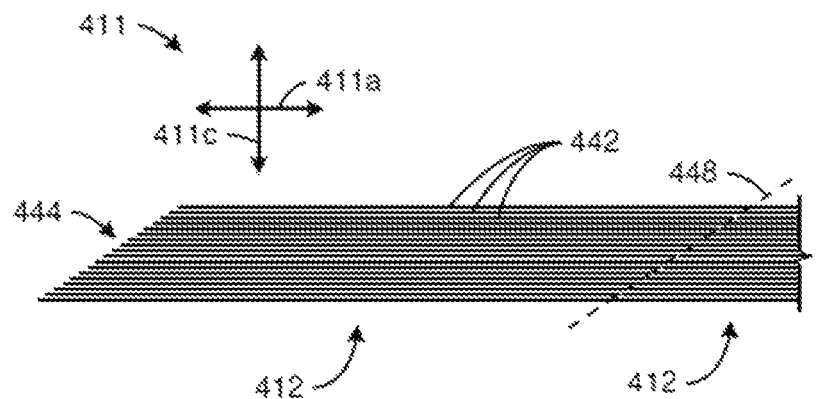
FIG. 14 is a schematic diagram showing various layers of granular material that may be laid down in the formation of different segments of a long part, wherein certain traveling walls have been omitted.

Referring to FIG. 14, in certain embodiments, one or more traveling walls 148b may be omitted. The one or more traveling walls 148b so omitted may be replaced by one or more ramps 444. The angle of a ramp 444 with respect to the horizontal may be less than a critical angle of response for the granular material 144. Thus, the one or more ramps 444 and corresponding granular material 144 may be stable without the one or more traveling walls 148b that were omitted. In such embodiments, an interface 448 between segments 412 may extend at the same angle as the ramp 444. Thus, a subsequent segment 412 may extend in the longitudinal direction 411a to overlap a ramp 444 of a preceding segment 412.

Figure 15:
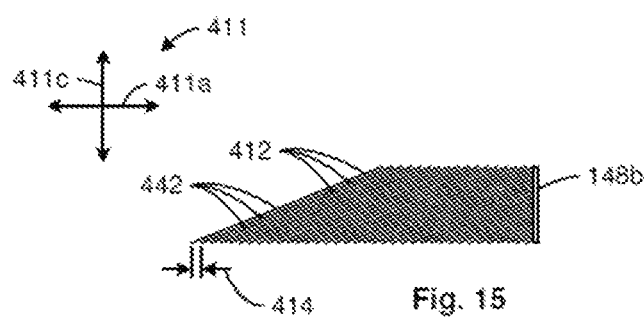
FIG. 15 is a schematic diagram showing various layers of granular material that may be laid down at an acute angle with respect to the horizontal.
Figure 16:
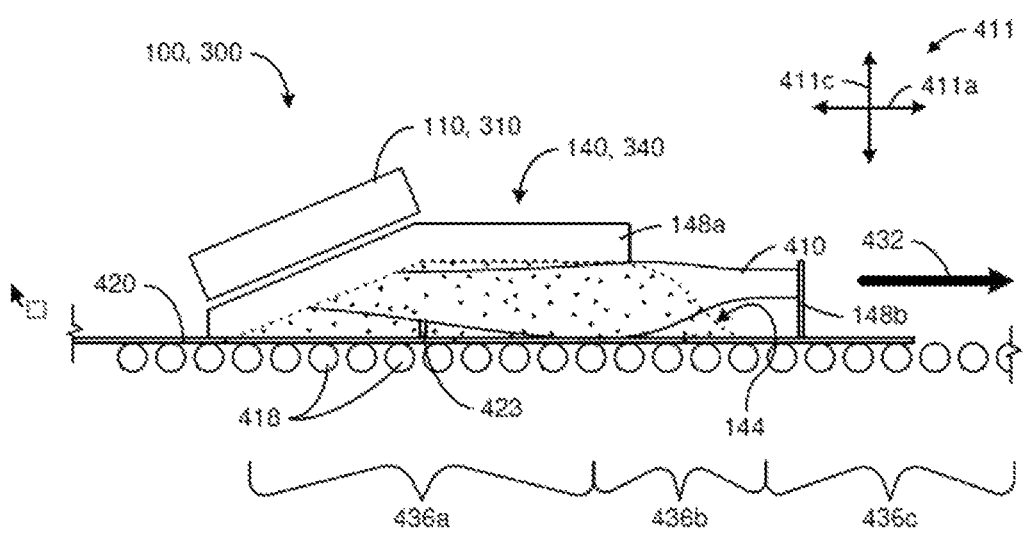
FIG. 16 is a side view of an alternative embodiment of a system for additive manufacture in accordance with the present invention with a near side wall removed so that a part in a particular phase of manufacture may be seen, the system laying down layers of granular material at an acute angle with respect to the horizontal.

Referring to FIGS. 15 and 16, in selected embodiments, the various layers 442 of granular material 144 laid down by a system 100, 300 in accordance with the present invention may extend at angle with respect to the horizontal. The angle may be greater than zero and less than or equal to a critical angle of repose for the granular material 144. In such embodiments, each segment 412 may correspond to a single layer 442 of granular material 144. Thus, a system 100, 300 may lay down a layer 442 of granular material 144, amalgamate selected granules within the layer 442, advance the conveyor a selected distance 414 (e.g., a small distance of about 20 to about 50 microns, depending on the size of the granules of the granular material 144), lay down another layer 442 of granular material 144, and so forth until a part 410 is complete.

When executing a process of additive manufacture at an acute angle with respect to the horizontal, one or more traveling walls 148b may be omitted if they are not needed to stabilize the granular material 144. For example, in the illustrated embodiment, a leading traveling wall 148b is included, but the intermediate traveling walls 148b have been omitted. Temporary structures 423 may be included as necessary to support a part 410 above one or more plates 420.

In certain embodiments, to "print" at an acute angle with respect to the horizontal, an energy patterning system 110, 310 or selected portions thereof may be secured at or near that angle with respect to the horizontal. In selected embodiments, the angle with respect to the horizontal at which a system 100, 300 prints may be selectively adjustable (e.g., controlled by a controller 150). Accordingly, a system 100, 300 may work with different granular materials 144 that have different critical angles of repose.

Parts or structures created by an additive manufacturing system to enable manufacture various parts, components, structures, frames, trusses, lattices, columns, tubes, beams, airfoils, blades, propellers, and the like of varying resolution, throughput, and length (including, but not limited to long structures) are discussed in the following.

Manufactured structures have at least one of a:

printed resolution [features/mm] higher than the value calculated by $$R = f_1\left(\frac{5070}{\dot{m}}\right)\left[\frac{\text{features}}{\text{mm}}\right] \qquad \text{Equation 1}$$

as a function of average mass deposition rate in [g/hr] achieved in creating the part;

a printed resolution [features/mm] higher than the value calculated by $$R = f_2\left(918054 * Z^{-(3.37*Z^{0.0557})}\right)\left[\frac{\text{features}}{\text{mm}}\right] \quad \text{Equation 2}$$

as a function of part longest dimension in [cm] of the part;
a printed mass deposition rate in [g/hr] as averaged over the time required to create the part is greater than the value calculated by $$\dot{m} = f_3\left(0.4871(Z)^2 + 6.8211(Z)\right)\left[\frac{\text{g}}{\text{hr}}\right] \quad \text{Equation 3}$$

as a function of part longest dimension in [cm] of the part;
a printed component size greater than or equal to that calculated by
Z=$f_4$ (10)[m]; and
a printed mass deposition rate in [g/hr] as averaged over the time required to create the part is greater than or equal to the value calculated by $$\dot{m} = f_5(15,000)\left[\frac{\text{g}}{\text{hr}}\right] \quad \text{Equation 5}$$

Equation 4 and Equation 5 are single parameter metrics supporting an observation that traditional powder bed additive manufacturing machines are unable to produce long structures (e.g. over 10 m long) at high production rates. For example, at 25 cc/hour, a traditional powder bed fusion machine would require 2.28 years to process a cubic meter of material. An additive manufacturing system such as disclosed herein could operate at 10,000 cc/hour, processing the same volume in only about 100 hours.

In another embodiment, a method of manufacturing a structure that can include, but is not limited to, a frame, a truss, at least one of a lattice structure, a honeycomb element, a prismatic element, a tetrahedral truss, a pyramidal truss, a three-dimensional kagome, an octet truss, a diamond textile, a diamond collinear, a square collinear, a multilayer lattice, a complex sandwich structure, a curved sandwich structure, a multi-order octet lattice structures, a truss, an angle, a triangular truss sections, a tees, a channel section, a column, a beam, an I-beam, a taper flange, a square box beam, a rectangular box beam, a tube, a tube with an ellipsoidal section, a walled tube with an internal wall being solid and impermeable to fluid flows, or a blade or airfoil structure, is described. A powdered metal material and an energy source that can include electron beams, solid state lasers, or multiple semiconductor lasers is provided. A beam from the energy source is directed toward an energy patterning unit to form a two-dimensional patterned energy beam. The two-dimensional patterned energy beam is directed against the metal powder material to form a structure having a size greater than or equal to that calculated by
Z=$f_4$ (10)[m]
where the scaling factors $\theta_4$ is selected to be greater than or equal to 1 and less than or equal to 5.

Figure 17A:
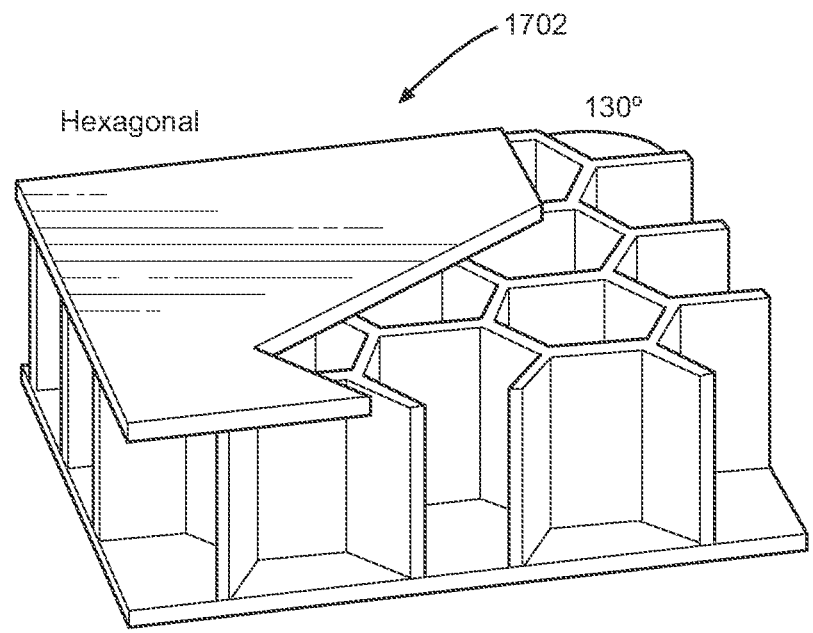
FIGS. 17A and 17B illustrate various structures and structural elements.
Figure 17A:
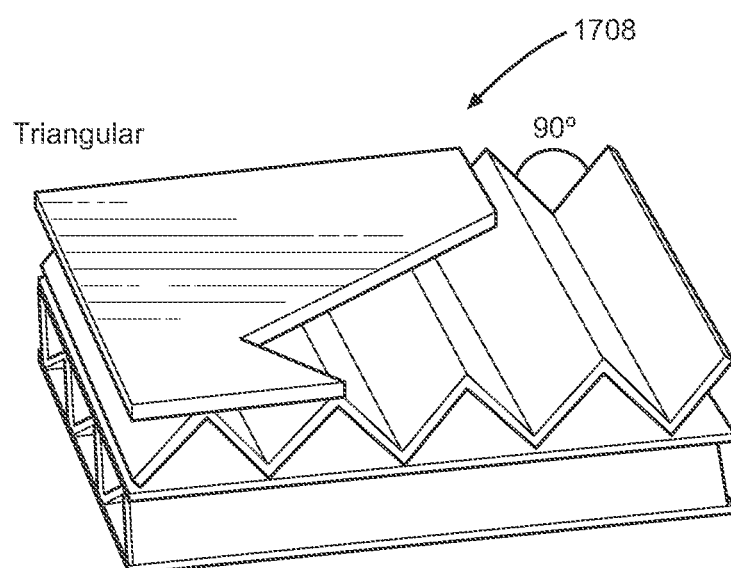
Figure 17A:
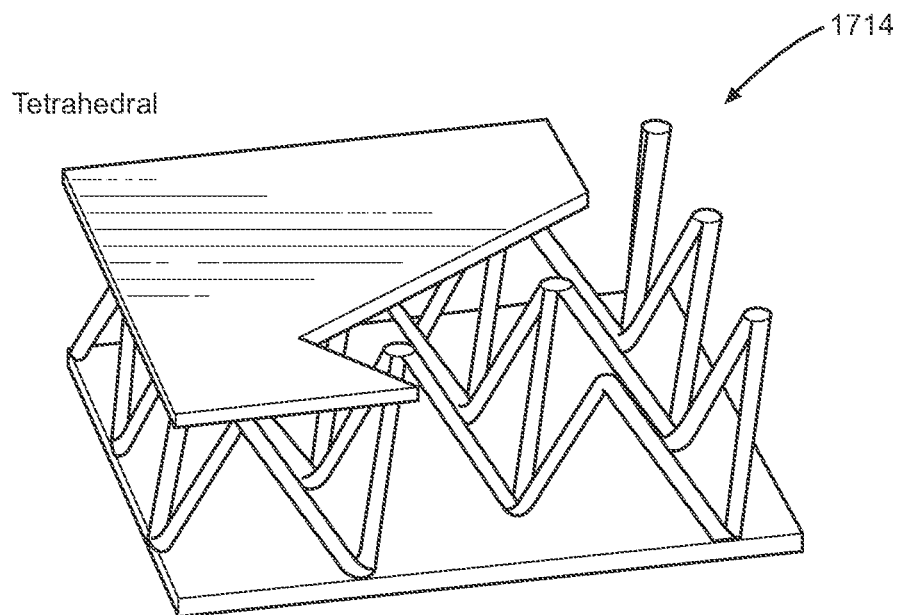
Figure 17A:
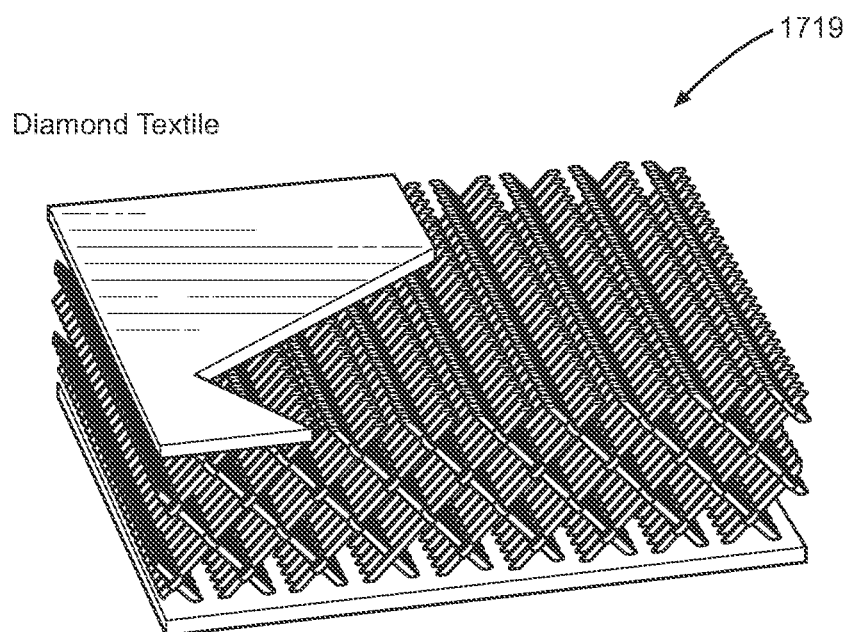
Figure 17A:
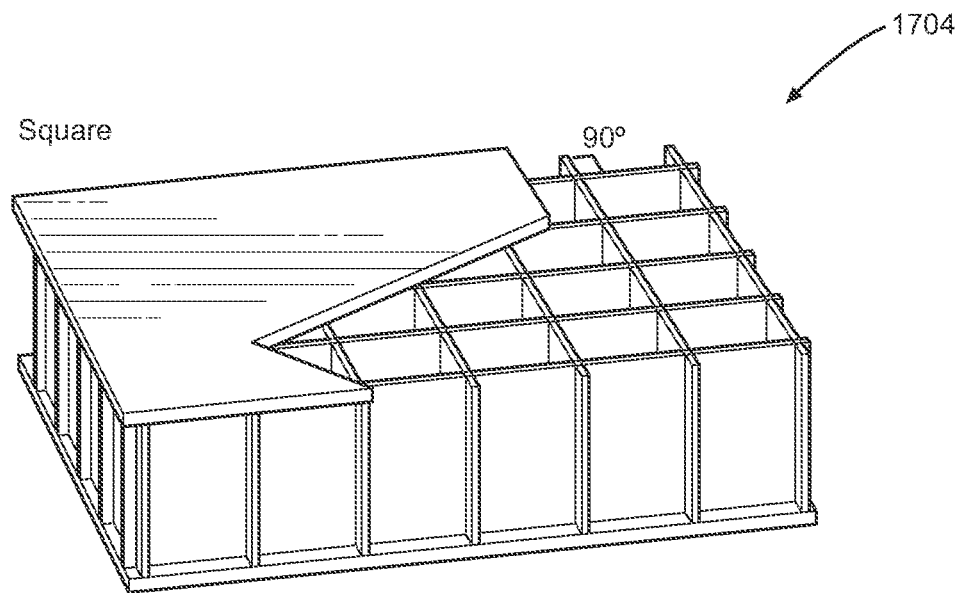
Figure 17A:
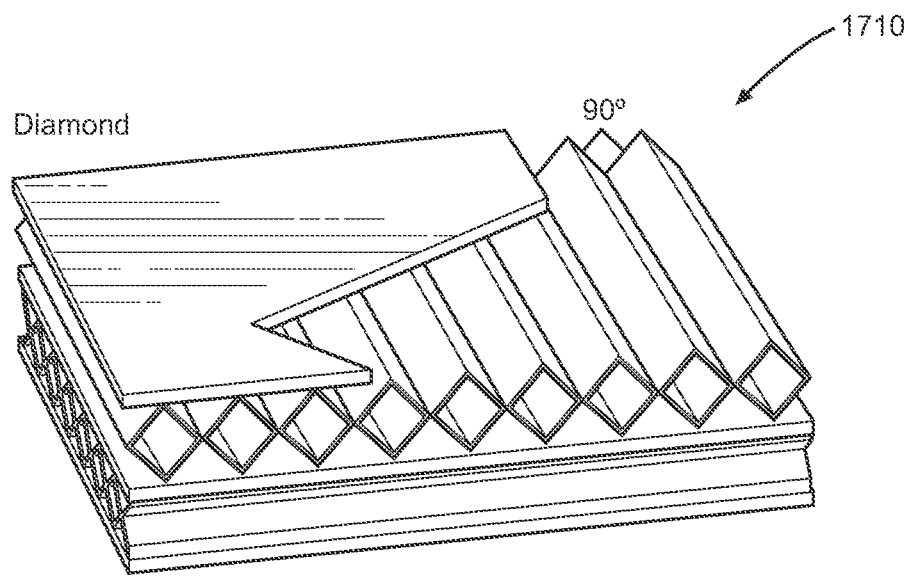
Figure 17A:
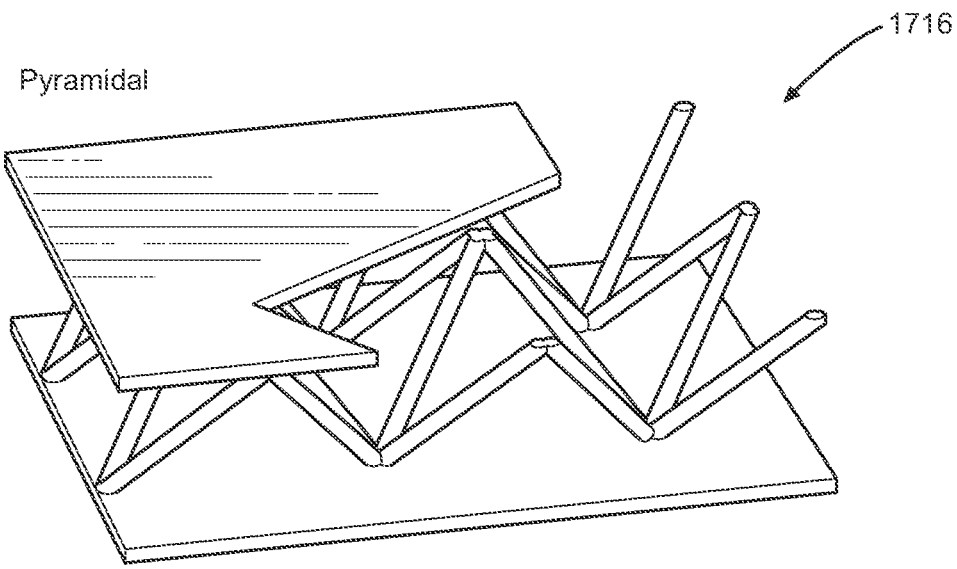
Figure 17A:
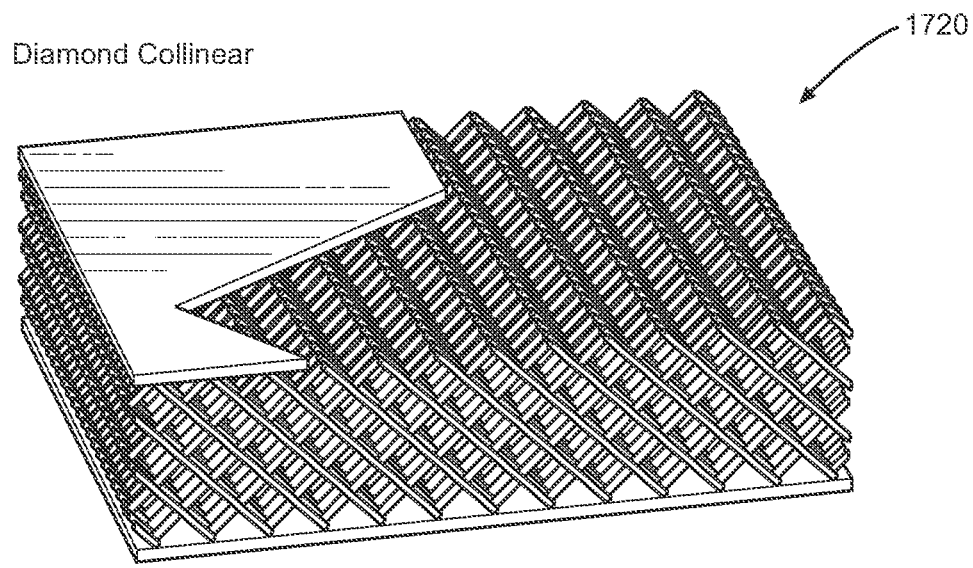
Figure 17A:
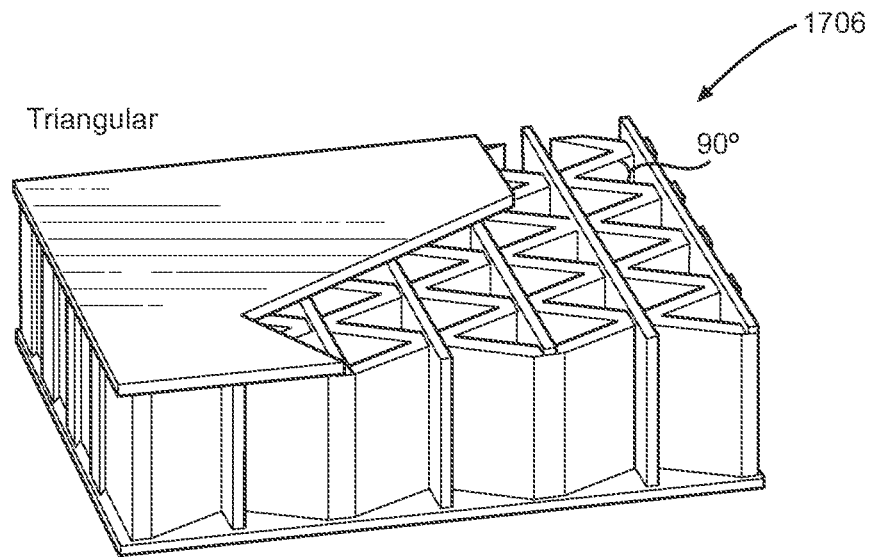
Figure 17A:
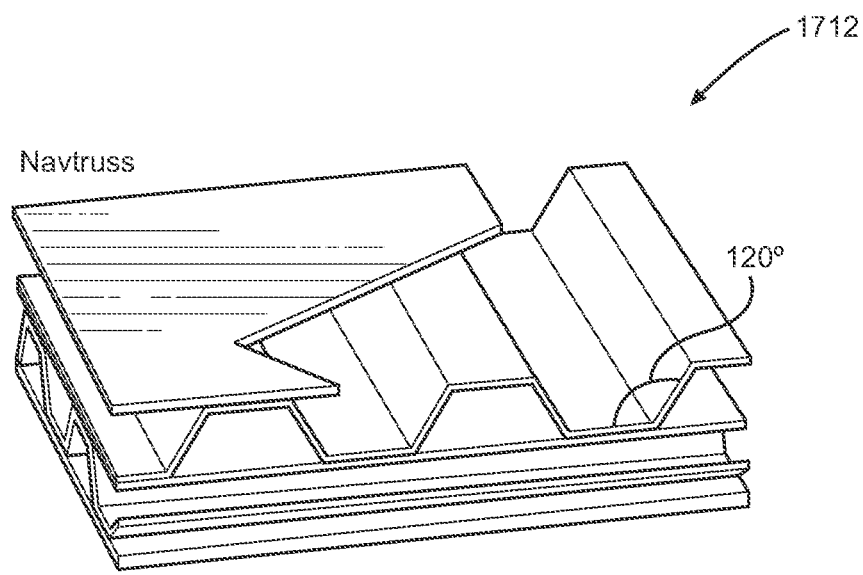
Figure 17A:
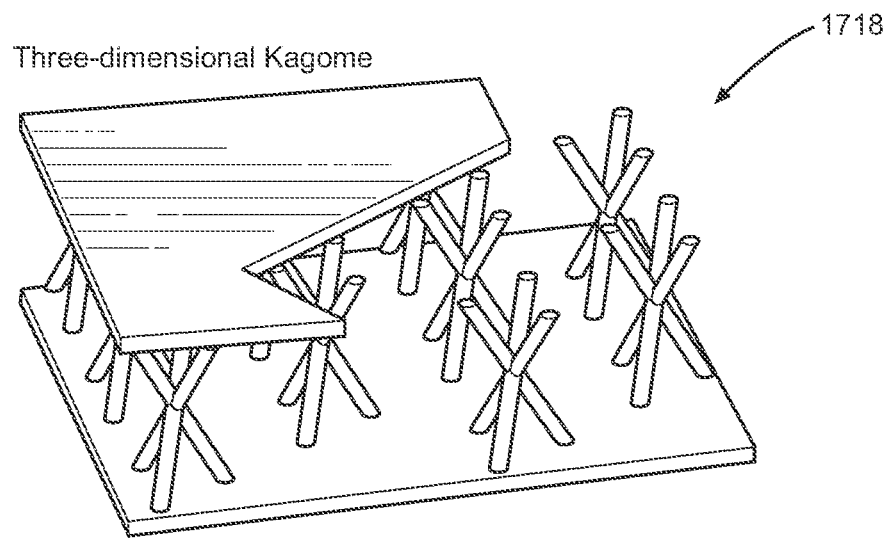
Figure 17A:
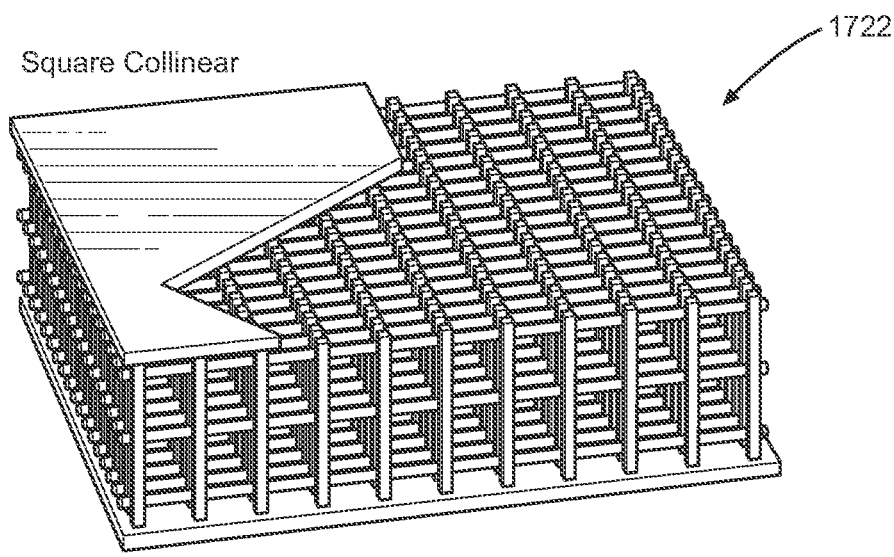
Figure 17B:
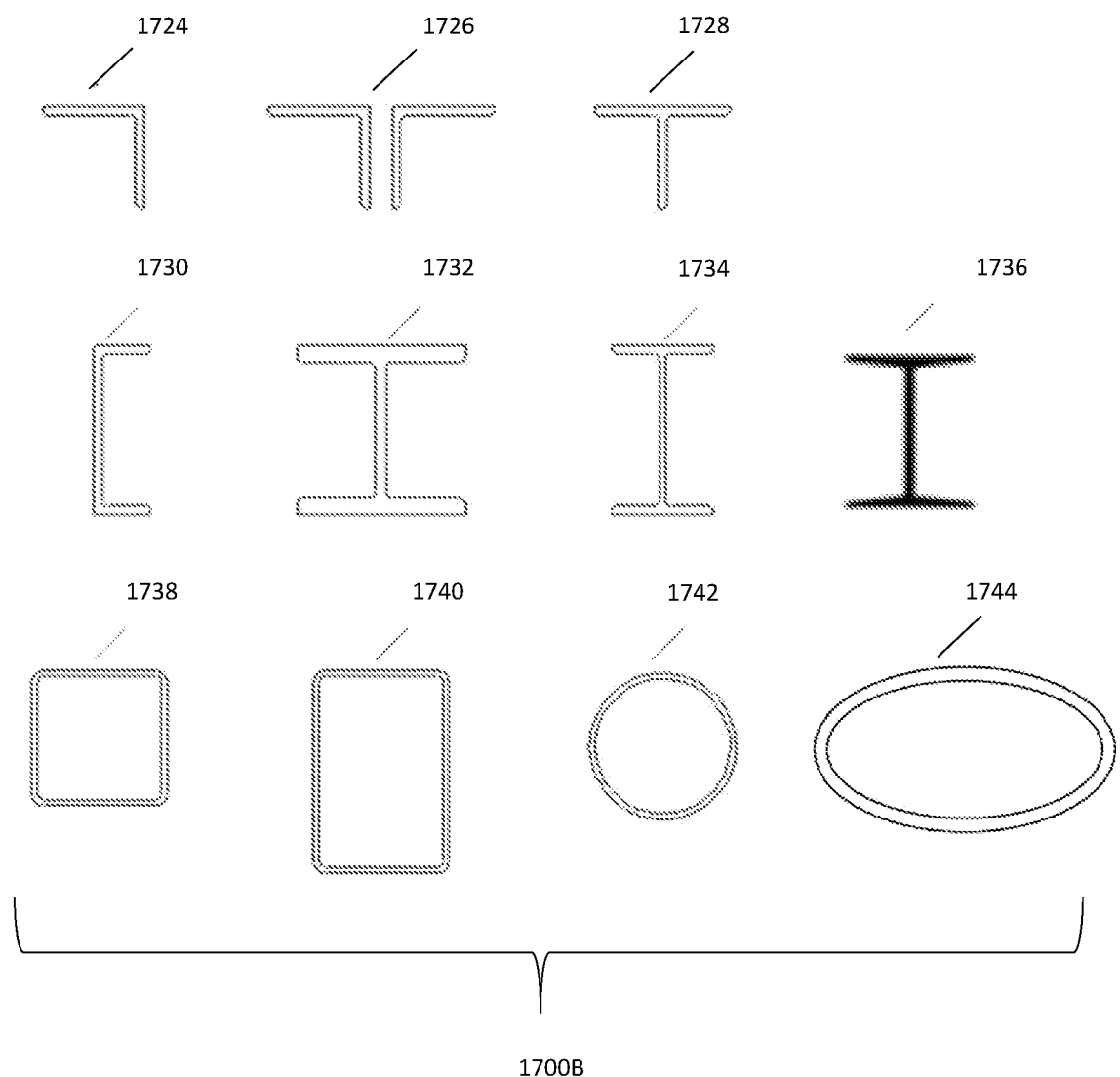

FIG. 17A illustrates various structures and structural elements 1700A suitable for printing with an additive manufacturing system having an energy source that can include multiple lasers and an energy patterning unit that can include a transmissive or reflective optically addressed light valve. Such structural elements can include load-resisting subsystem of a structure in which the structural system transfers loads through interconnected structural components, members, or elements. In addition, a structure can include any structure formed from only a small number of structural elements that include columns, beams, plates, arches, shells, catenaries and trusses. Structure and structural elements can also be components of frames. Frames are commonly defined as rigid supporting structure of an object such as a vehicle, building, or piece of furniture. Frames can support other components, and can be formed of relatively slender pieces, joined so as to surround sizeable empty spaces or nonstructural panels, and generally used as a major support in building or engineering works, machinery, furniture, or the like.

The described structures and structural elements are fully or substantially printed using an additive manufacturing process that can include multiple lasers and an energy patterning unit that can include a transmissive or reflective optically addressed light valve. The structures must be printed with metal, ceramics, plastics, or a metallo-ceramic hybrid containing one or more of these materials.

Structures can include lattice structures embedded in a material sandwich representation created by top and bottom enclosing plates. Honeycomb-type structures that use extruded elements are very stiff in the extruded direction. A well-known orientation is with a hexagonal cross-section 1702 with six points of contact to adjacent cells, each node connecting three cells. The square cross section 1704 can also be made with each cell having eight points of contact to nine adjacent cells, each node having four points of contact, and triangular cross section 1706 with each cell having twelve points of contact, twelve adjacent cells, and each node connecting six cells. Another embodiment is a prismatic orientation that uses alternating or non-alternating orientations of extruded shapes such as a triangle 1708, a diamond 1710, and the navtruss 1712. Another embodiment of a lattice avoids extrusion altogether and has isotropic properties for the internal mesh. Some representative orientations are the tetrahedral truss 1714, the pyramidal truss 1716, the three-dimensional kagome 1718 (the basis of the octet truss), diamond textile 1719, diamond collinear 1720, and square collinear 1722. Multilayer lattices and complex or curved sandwich structures are also possible to additively manufacture. Multi-order octet lattice structures (structure within a structure) can be additively manufactured. For example, internal triangular trusses can make up the truss members in a larger scale octet truss of which the macro triangular truss is a geometrical sub-component.

Other commonly used structural elements 1700B that provide stiffness and strength in structures across distances can be additively manufactured. These include angles 1724, truss sections 1726, tees 1728, and channel sections 1730. Common structural beam types include columns 1732, beams or I-beams 1734, and taper flanges 1736. Some additional examples of very common and structurally efficient shapes are a square box beam 1738, a rectangular box beam 1740, and a tube section 1742. An ellipsoid section 1744 can be a variant of the common tube section that is sometimes also used for structural members. Tubes can also include internal and outer walls, with the internal wall being solid and impermeable to gas or fluid flows.

Figure 18A:
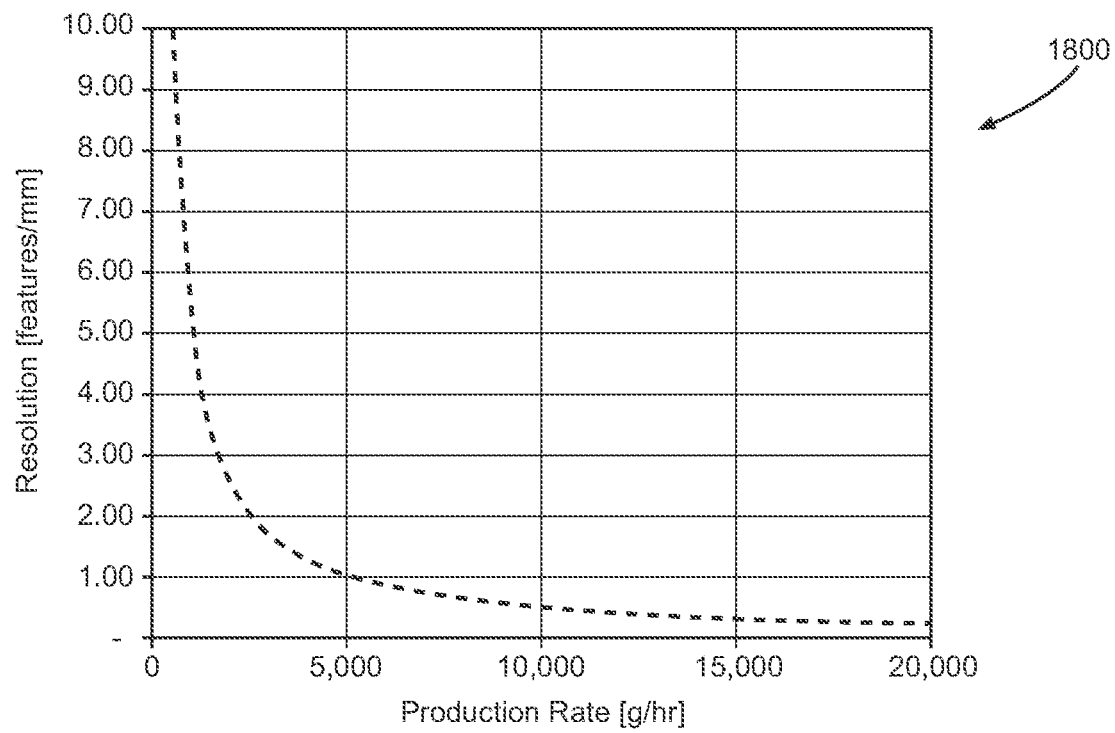
FIG. 18A is a graph with bounding line for resolution [features/mm] vs mass throughput [g/hr]

FIG. 18A is a graph 1800 with bounding line for resolution [features/mm] vs mass throughput [g/hr] tradeoff. The area under the curve represents the capabilities of traditional additive manufacturing techniques, whereas the area above the curve represents design space attainable using an additive manufacturing system having an energy source that can include multiple lasers and an energy patterning unit that can include a transmissive or reflective optically addressed light valve.

Figure 18B:
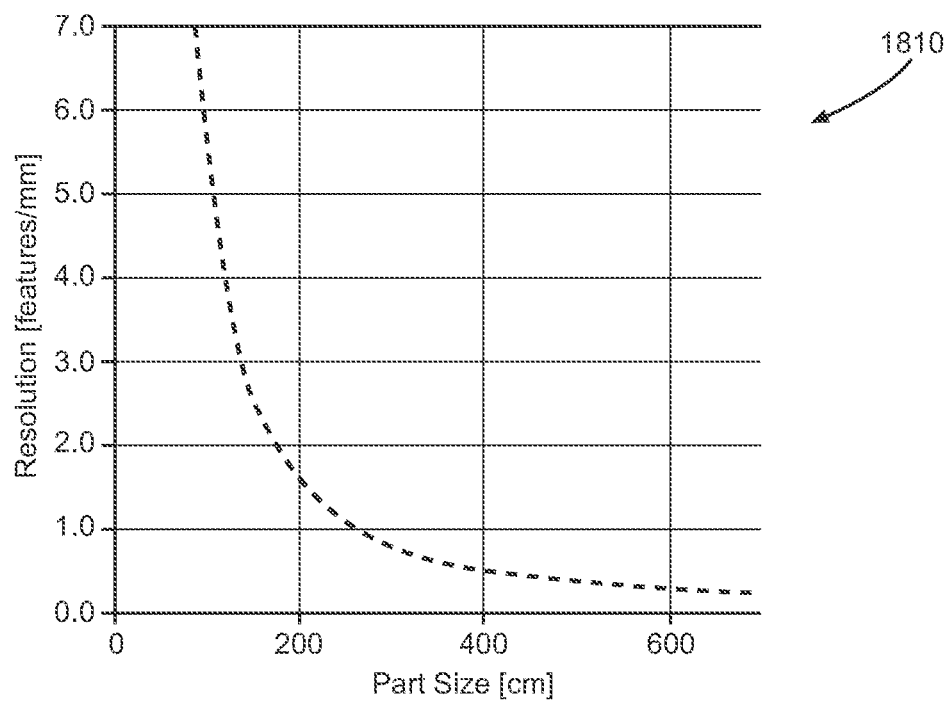
FIG. 18B is a graph with bounding line for resolution [features/mm] vs part size [cm]

FIG. 18B is a graph 1810 with bounding line for resolution [features/mm] vs part size [cm]. The area under the curve represents the capabilities of traditional additive manufacturing techniques, whereas the area above the curve represents design space attainable using an additive manufacturing system having an energy source that can include multiple lasers and an energy patterning unit that can include a transmissive or reflective optically addressed light valve.

Figure 18C:
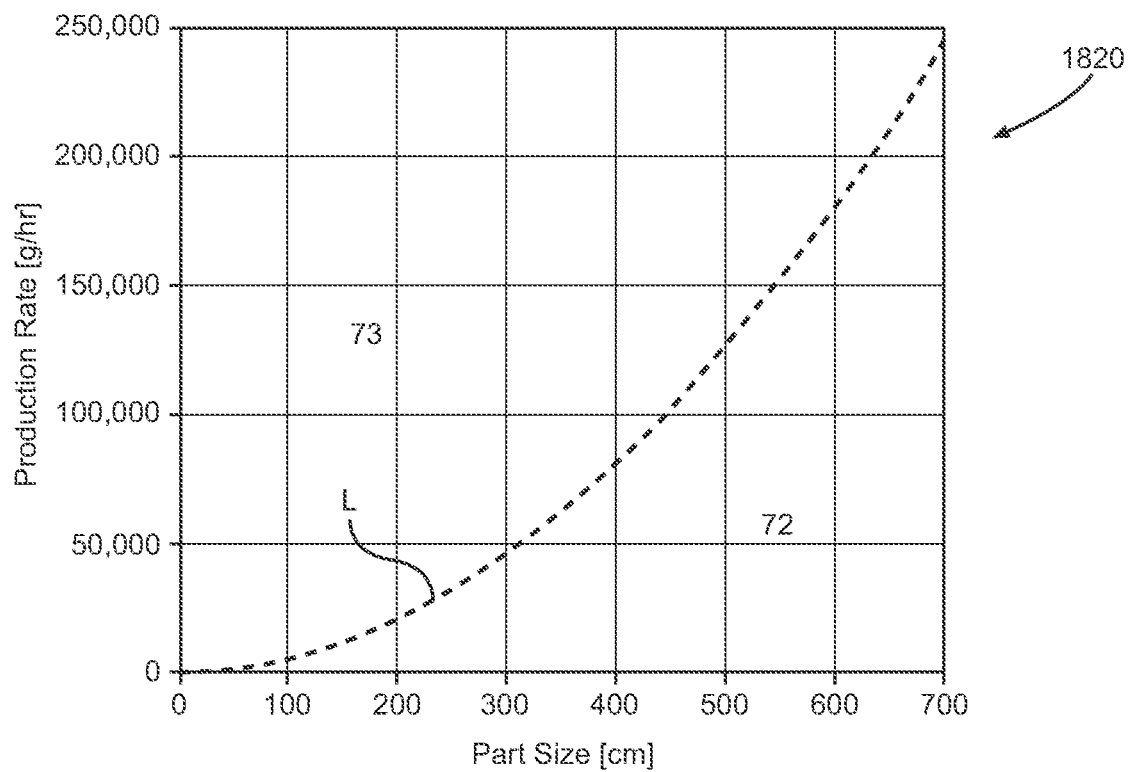
FIG. 18C is a graph with bounding line for mass throughput [g/hr] vs part size [cm]

FIG. 18C is a graph 1820 with bounding line for mass throughput [g/hr] vs part size [cm]. The area under the curve represents the capabilities of traditional additive manufacturing techniques, whereas the area above the curve 71 represents design space attainable using an additive manufacturing system having an energy source that can include multiple lasers and an energy patterning unit that can include a transmissive or reflective optically addressed light valve.

Figure 18D:
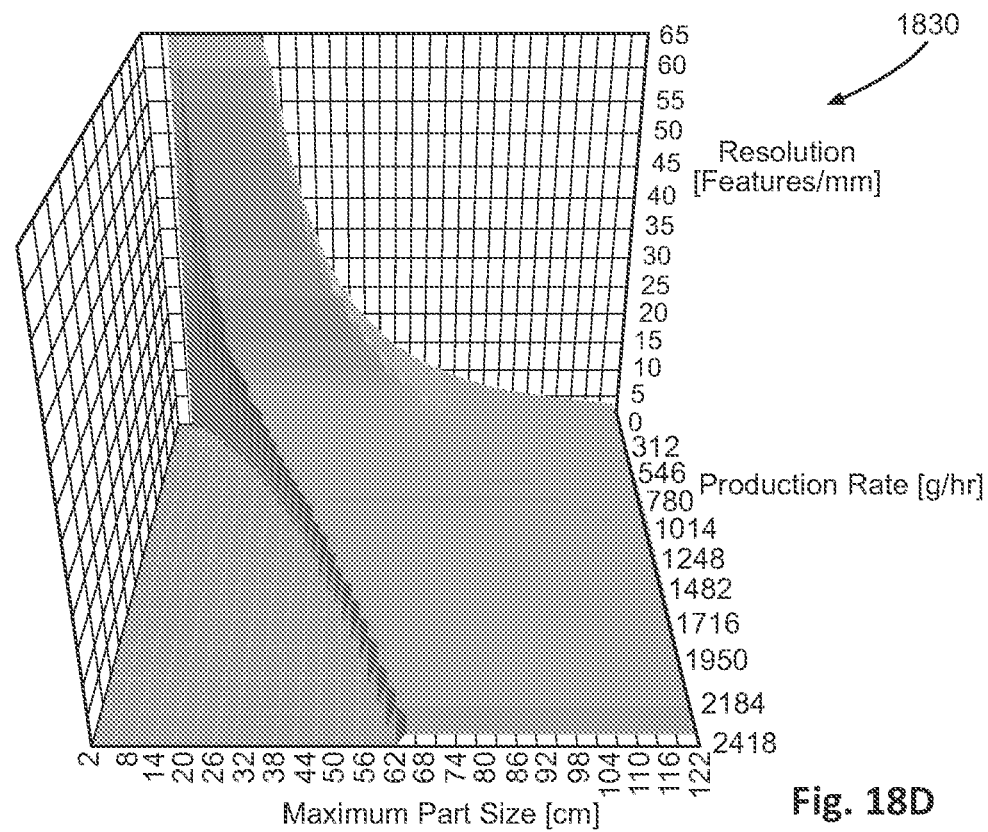
FIG. 18D is a graph with bounding volume for resolution [features/mm], mass throughput [g/hr], and part size [cm]

FIG. 18D is a graph 1830 with bounding volume for resolution [features/mm], mass throughput [g/hr], and part size [cm]. The volume enclosed represents the capabilities of traditional additive manufacturing techniques, whereas the volume outside this boundary represents design space attainable using an additive manufacturing system having an energy source that can include multiple lasers and an energy patterning unit that can include a transmissive or reflective optically addressed light valve.

Engineered truss structures are an important class of structures that can be additively manufactured. Engineered truss structures are three-dimensional lattices that allow for a change in material properties according to their geometrical configuration. The lattice could be a sparse octet truss that permits considerable mass to be removed from the object while increasing the specific stiffness (stiffness per unit mass), or it could be a multi-material structure allowing for combinatorial augmentation of material properties between the two materials. Other truss structures could include octet truss lattice structure in a cube shape or a multi-order octet lattice structure (structure within a structure). A multi-order structure uses internal triangular trusses to form truss members in a larger scale octet truss, of which the macro triangular truss is a geometrical sub-component. Co-linear stacked square lattices that are stiff in compression can be formed, as well as offset stacked square lattice structures that have high shear strength can be additively manufactured. Non-geometric or irregular truss structures are also possible, similar to organic internal truss systems in certain animal bones. All of the discussed truss structures can be manufactured using additive manufacturing techniques with multiple lasers and an energy patterning unit that can include, but is not limited to, a transmissive or reflective optically addressed light valve.

Figure 19A:
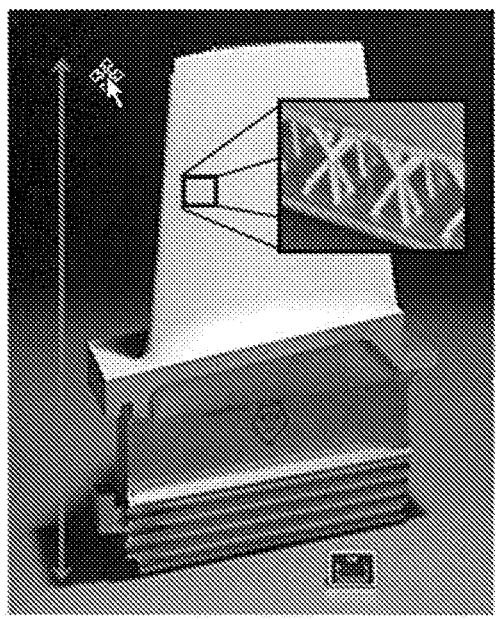
FIGS. 19A and 19B respectively illustrate an additively manufactured airfoil and propeller blade.
Figure 19B:
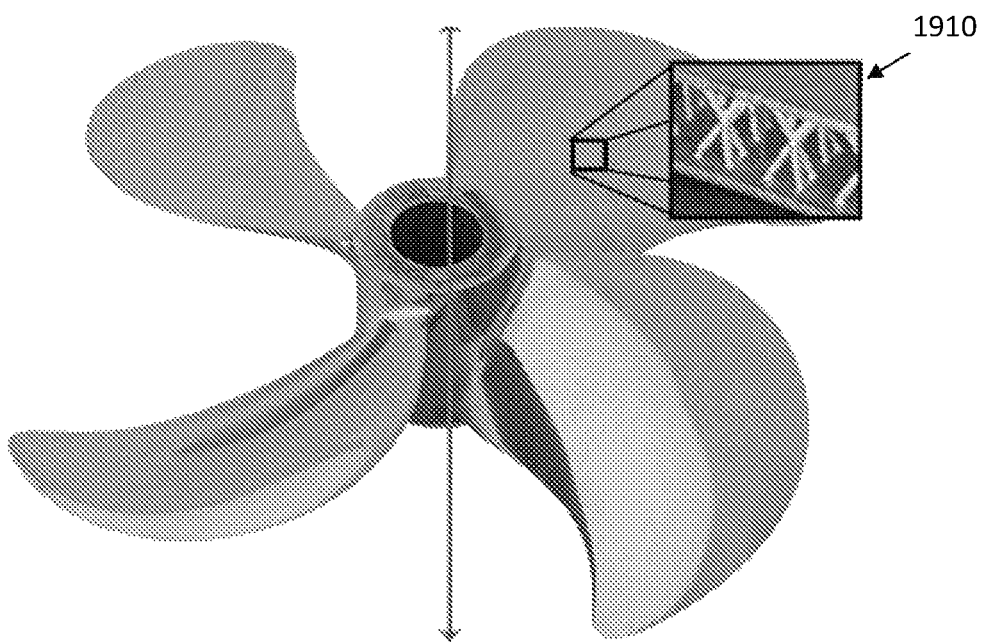

FIGS. 19A and 19B illustrates another important class of blade or airfoil structures that interact with fluid such as air or water. In one embodiment, blade or airfoil structures can be additively manufactured with an energy source and a two dimensional energy patterning unit that in certain embodiments can include a transmissive or reflective optically addressed light valve. Airfoil 1900 and propeller 1910 such as respectively illustrated in FIGS. 19A and 19B are required to be strong, lightweight, and able to withstand constantly changing forces. These blade or airfoil structures can be a wing, blade (of a propeller, rotor, or turbine), rudder or sail, aileron, elevator, flap, horizontal stabilizer, tailplane, leading edge, rotary wing, rotor blade, rudder, spoiler, stabilizer, trailing edge, or vertical tail.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. An apparatus for additive manufacture in a three-dimensional space corresponding to longitudinal, lateral, and transverse directions that are orthogonal to one another, the apparatus comprising:
    a conveyor configured to sequentially advance each portion of a continuous part in the longitudinal direction from a first zone to a second zone;
    an energy patterning system configured to amalgamate, within the first zone, selected granules of a granular material with unamalgamated granules of the granular material removed within the second zone, wherein the conveyor is configured to advance a first portion of the continuous part from the second zone to a third zone while (1) a last portion of the continuous part is formed within the first zone and (2) the first portion is maintained in the same position in the lateral and transverse directions that the first portion occupied within the first zone and the second zone; and
    a processor configured to determine a current position or orientation of the continuous part by locating one or more features of a feature map in an intersecting wall that intersects two neighboring portions of the continuous part,
    wherein, in amalgamating the selected granules of the granular material, the energy patterning system is configured to form a two-dimensional patterned energy beam used in the amalgamating.

2. The apparatus of claim 1, wherein, in amalgamating, the energy patterning system is configured to direct the two-dimensional patterned energy at the selected granules.

3. The apparatus of claim 2, wherein, in amalgamating, the energy patterning system is further configured to perform operations comprising:
    distributing a first layer of the plurality of layers of granules of the granular material;
    directing the radiant energy at all granules within the first layer that form part of the selected granules;
    distributing a second layer of the plurality of layers of granules of the granular material over the top of the first layer; and
    directing the radiant energy at all granules within the second layer that form part of the selected granules.

4. The apparatus of claim 3, wherein the first layer defines a first plane and the second layer defines a second plane that is parallel to the first plane.

5. The apparatus of claim 4, wherein the first and second planes are both horizontal planes.

6. The apparatus of claim 4, wherein the first and second planes both extend at an angle with respect to a horizontal plane that is greater than zero and less than or equal to a critical angle of repose of the granular material.

7. The apparatus of claim 2, wherein, in amalgamating, the energy patterning system is further configured to create a wall from certain granules of the granular material, wherein the wall separates a first portion of the granular material from a second portion of the granular material.

8. The apparatus of claim 7, wherein, in amalgamating, the energy patterning system is further configured to perform operations comprising:
   forming the first portion of the continuous part within the first portion of the granular material; and
   forming a second portion of the continuous part within the second portion of the granular material.

9. The apparatus of claim 8, wherein, in amalgamating, the energy patterning system is further configured to perform operations comprising:
   connecting the first portion of the continuous part to a first side of the wall; and
   connecting the second portion of the continuous part to a second, opposite side of the wall.

10. The apparatus of claim 9, wherein, the creating the wall and the forming the first portion of the continuous part within the first portion of the granular material occur substantially simultaneously.

11. The apparatus of claim 10, wherein the connecting the second portion of the continuous part to the second, opposite side of the wall commences after the wall is complete.

12. The apparatus of claim 11, wherein at least a portion of the continuous part in the same position is supported by the wall within the third zone in the lateral and transverse directions that the at least a portion of the continuous part occupied within the first zone and the second zone.

13. The apparatus of claim 12, wherein the wall defines a third plane that is a vertical plane.

\* \* \* \* \*